US012677571B2

(12) United States Patent
Jung et al.

(10) Patent No.: US 12,677,571 B2
(45) Date of Patent: \*Jul. 7, 2026

(54) DISPLAY DEVICE INCLUDING A MULTI-LAYER THIN FILM ENCAPSULATION LAYER

(71) Applicant: SAMSUNG DISPLAY CO., LTD., Yongin-si (KR)

(72) Inventors: Hyun Ho Jung, Yongin-si (KR); Young Tae Kim, Yongin-si (KR); Hyun Gue Song, Yongin-si (KR); Hee Seong Jeong, Yongin-si (KR); Sun Jin Joo, Yongin-si (KR); Sang Min Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 447 days.

This patent is subject to a terminal disclaimer.

(21) Appl. No.: 18/313,664

(22) Filed: May 8, 2023

(65) Prior Publication Data

US 2024/0099104 A1 Mar. 21, 2024

(30) Foreign Application Priority Data

Sep. 16, 2022 (KR) ........................ 10-2022-0116723

(51) Int. Cl.
*H10K 59/80* (2023.01)

(52) U.S. Cl.
CPC ......... *H10K 59/873* (2023.02); *H10K 59/879* (2023.02)

(58) Field of Classification Search
CPC ............................ H10K 59/873; H10K 59/879
(Continued)

(56) References Cited

U.S. PATENT DOCUMENTS 10,991,913 B2 4/2021 Jang et al.
2016/0322444 A1* 11/2016 Kang ..................... H10K 59/38
(Continued)

FOREIGN PATENT DOCUMENTS

EP 3703147 A1 9/2020
EP 3929999 A1 12/2021
(Continued)

OTHER PUBLICATIONS

K-PION Korean Search (Year: 2024).*

*Primary Examiner* — James R Greece
*Assistant Examiner* — Hana S Featherly
(74) *Attorney, Agent, or Firm* — F. CHAU & ASSOCIATES, LLC

(57) ABSTRACT

A display device includes a light emitting element including a pixel electrode, a light emitting layer, and a common electrode. A capping layer is disposed on the common electrode. An auxiliary layer is disposed on the capping layer. A thin film encapsulation layer includes a first encapsulation layer, a second encapsulation layer, and a third encapsulation layer. The first encapsulation layer includes a first inorganic insulating layer including silicon nitride; a second inorganic insulating layer including silicon oxide; and a third inorganic insulating layer including silicon oxynitride. The auxiliary layer has a thickness of 200 Å to 1400 Å, the first inorganic insulating layer has a thickness of 400 Å to 3500 Å, the second inorganic insulating layer has a thickness of 200 Å to 2400 Å, and the third inorganic insulating layer has a thickness of 4000 Å or more.

23 Claims, 16 Drawing Sheets

(58) Field of Classification Search
　　　USPC ........................................................ 313/512
　　　See application file for complete search history.

(56)　　　　　　　　References Cited

U.S. PATENT DOCUMENTS

2021/0305537  A1　　9/2021　Song et al.
2022/0140290  A1　　5/2022　Choi et al.

FOREIGN PATENT DOCUMENTS

KR　　10-2018-0016694　　　2/2018
KR　　10-2019-0093833  A　　8/2019
KR　　10-2019-0136692　　12/2019
KR　　10-2021-0122344　　10/2021
KR　　10-2022-0060071　　　5/2022
KR　　10-2022-0111768　　　8/2022

* cited by examiner

DISPLAY DEVICE INCLUDING A MULTI-LAYER THIN FILM ENCAPSULATION LAYER

CROSS-REFERENCE TO RELATED APPLICATION

This application claims priority under 35 U.S.C. § 119 to Korean Patent Application No. 10-2022-0116723, filed on Sep. 16, 2022 in the Korean Intellectual Property Office, the contents of which are herein incorporated by reference in its entirety.

TECHNICAL FIELD

The present disclosure relates to a display device and, more particularly, to a display device including a multi-layer thin film encapsulation layer.

DISCUSSION OF THE RELATED ART

Display devices have been applied to various electronic devices such as smartphones, digital cameras, laptop computers, navigation devices, and smart televisions. One popular type of display device is the flat panel display device that has a thin and light structure that is well suited for incorporation into various electronic devices. Examples of flat panel display devices include liquid crystal display (LCD) devices, field emission display devices, and organic light emitting diode (OLED) display devices. Among the flat panel display devices, emissive-type display device may use pixels that emit light themselves without the need for a backlight unit.

SUMMARY

A display device includes a light emitting element disposed on a substrate. The light emitting element includes a pixel electrode, a light emitting layer, and a common electrode. A capping layer is disposed on the common electrode of the light emitting device. An auxiliary layer is disposed on the capping layer. A thin film encapsulation layer including a first encapsulation layer is disposed on the auxiliary layer. A second encapsulation layer is disposed on the first encapsulation layer. A third encapsulation layer is disposed on the second encapsulation layer. The first encapsulation layer includes a first inorganic insulating layer disposed on the auxiliary layer and including silicon nitride, a second inorganic insulating layer disposed on the first inorganic insulating layer and including silicon oxide, and a third inorganic insulating layer disposed on the second inorganic insulating layer and including silicon oxynitride. The auxiliary layer has a thickness in a range of 200 Å to 1400 Å. The first inorganic insulating layer has a thickness in a range of 400 Å to 3500 Å. The second inorganic insulating layer has a thickness in a range of 200 Å to 2400 Å. The third inorganic insulating layer has a thickness of 4000 Å or more.

The first inorganic insulating layer may be disposed directly on the auxiliary layer.

The auxiliary layer may have a refractive index that is smaller than a refractive index of the capping layer, the first inorganic insulating layer may have a refractive index that is greater than the refractive index of the auxiliary layer, the second inorganic insulating layer may have a refractive index that is smaller than the refractive index of the first inorganic insulating layer, and the third inorganic insulating layer may have a refractive index that is greater than the refractive index of the second inorganic insulating layer.

The capping layer may have the refractive index in the range of 1.60 to 2.30. The auxiliary layer may have the refractive index in the range of 1.20 to 1.62, but smaller than the refractive index of the capping layer. The first inorganic insulating layer may have the refractive index in the range of 1.70 to 2.0. The second inorganic insulating layer may have the refractive index in the range of 1.20 to 1.62. The third inorganic insulating layer may have the refractive index in the range of 1.48 to 1.89, but greater than the refractive index of the second inorganic insulating layer.

The capping layer may have a thickness of 850 Å. The auxiliary layer may have a thickness of 400 Å. The first inorganic insulating layer may have a thickness of 1300 Å. The second inorganic insulating layer may have a thickness of 1400 Å. The third inorganic insulating layer may have a thickness of 7300 Å.

The capping layer may have a thickness of 770 Å. The auxiliary layer may have a thickness of 400 Å. The first inorganic insulating layer may have a thickness of 1300. The second inorganic insulating layer may have a thickness of 1550 Å. The third inorganic insulating layer may have a thickness of 7300 Å.

The capping layer may have a thickness of 850 Å. The auxiliary layer may have a thickness of 400 Å. The first inorganic insulating layer may have a thickness of 1500 Å. The second inorganic insulating layer may have a thickness of 400 Å. The third inorganic insulating layer may have a thickness of 7300 Å.

The capping layer may have a thickness of 750 Å. The auxiliary layer may have a thickness of 400. The first inorganic insulating layer may have a thickness of 1600 Å. The second inorganic insulating layer may have a thickness of 400 Å. The third inorganic insulating layer may have a thickness of 7300 Å.

The first encapsulation layer may further include a fourth inorganic insulating layer disposed on the third inorganic insulating layer, and a fifth inorganic insulating layer disposed on the fourth inorganic insulating layer. The fourth inorganic insulating layer may include silicon oxynitride and may have a thickness in a range of 300 Å to 1000 Å.

The fourth inorganic insulating layer may have a refractive index that is smaller than a refractive index of the third inorganic insulating layer, and the fifth inorganic insulating layer may have a refractive index that is smaller than the refractive index of the fourth inorganic insulating layer.

The fourth inorganic insulating layer may have a thickness of 700 Å, and the fifth inorganic insulating layer may have a thickness of 800 Å.

The display device may further include a sixth inorganic insulating layer disposed between the first inorganic insulating layer and the auxiliary layer. The sixth inorganic insulating layer may include silicon oxynitride and may have a refractive index that is smaller than a refractive index of the fifth inorganic insulating layer.

A display device includes a light emitting element disposed on a substrate and including a pixel electrode, a light emitting layer, and a common electrode. A capping layer is disposed on the common electrode of the light emitting device. An auxiliary layer is disposed on the capping layer. A thin film encapsulation layer including a first encapsulation layer is disposed on the auxiliary layer. A second encapsulation layer is disposed on the first encapsulation layer. A third encapsulation layer is disposed on the second encapsulation layer. The first encapsulation layer includes a first inorganic insulating layer disposed on the auxiliary layer and including silicon nitride, a second inorganic insulating layer disposed on the first inorganic insulating layer and including silicon oxide, and a third inorganic insulating layer disposed on the second inorganic insulating layer and including silicon oxynitride. The capping layer has a refractive index in the range of 1.60 to 2.30. The auxiliary layer has a refractive index in the range of 1.20 to 1.62, but smaller than the refractive index of the capping layer. The first inorganic insulating layer has a refractive index in the range of 1.70 to 2.0. The second inorganic insulating layer has a refractive index in the range of 1.20 to 1.62. The third inorganic insulating layer has a refractive index in the range of 1.48 to 1.89, but greater than the refractive index of the second inorganic insulating layer.

The auxiliary layer may have a refractive index that is smaller than the refractive index of the capping layer. The first inorganic insulating layer may have a refractive index that is greater than the refractive index of the auxiliary layer. The second inorganic insulating layer may have a refractive index that is smaller than the refractive index of the first inorganic insulating layer. The third inorganic insulating layer may have a refractive index that is greater than the refractive index of the second inorganic insulating layer.

The capping layer may have a refractive index of 1.97. The first inorganic insulating layer may have a refractive index of 1.89. The second inorganic insulating layer may have a refractive index of 1.48.

The auxiliary layer may include lithium fluoride (LiF) and may have a refractive index of 1.39.

The auxiliary layer may include silicon oxynitride and may have a refractive index within a range of 1.48 to 1.57.

The third inorganic insulating layer may have a refractive index of 1.62.

The third inorganic insulating layer may have a refractive index within a range of 1.57 to 1.77.

The display device may further include a sixth inorganic insulating layer disposed between the first inorganic insulating layer and the auxiliary layer. The sixth inorganic insulating layer may include silicon oxynitride and may have a refractive index in the range of 1.48 to 1.7, but smaller than the refractive index of the first inorganic insulating layer.

An electronic device includes a display device including a display area and a non-display area at least partially surrounding the display area. An optical device overlaps a portion of the display area of the display device. The display device includes a light emitting element disposed on a substrate and including a pixel electrode, a light emitting layer, and a common electrode. A capping layer is disposed on the common electrode of the light emitting device. An auxiliary layer is disposed on the capping layer. A thin film encapsulation layer including a first encapsulation layer is disposed on the auxiliary layer. A second encapsulation layer is disposed on the first encapsulation layer. A third encapsulation layer is disposed on the second encapsulation layer. The first encapsulation layer includes a first inorganic insulating layer disposed on the auxiliary layer and including silicon nitride, a second inorganic insulating layer disposed on the first inorganic insulating layer and including silicon oxide, and a third inorganic insulating layer disposed on the second inorganic insulating layer and including silicon oxynitride. The auxiliary layer has a thickness in a range of 200 Å to 1400 Å. The first inorganic insulating layer has a thickness in a range of 400 Å to 3500 Å. The second inorganic insulating layer has a thickness in a range of 200 Å to 2400 Å. The third inorganic insulating layer has a thickness in a range of 4000 Å or more.

The capping layer may have a refractive index in the range of 1.60 to 2.30. The auxiliary layer may have a refractive index in the range of 1.20 to 1.62, but smaller than the refractive index of the capping layer. The first inorganic insulating layer may have a refractive index in the range of 1.70 to 2.0. The second inorganic insulating layer may have a refractive index in the range of 1.20 to 1.62. The third inorganic insulating layer may have a refractive index in the range of 1.48 to 1.89, but greater than the refractive index of the second inorganic insulating layer.

The first encapsulation layer may further include a fourth inorganic insulating layer disposed on the third inorganic insulating layer, and a fifth inorganic insulating layer disposed on the fourth inorganic insulating layer. The fourth inorganic insulating layer may include silicon oxynitride and may have a thickness in a range of 300 Å to 1000 Å. The fourth inorganic insulating layer may have a refractive index that is smaller than a refractive index of the third inorganic insulating layer. The fifth inorganic insulating layer may have a refractive index that is smaller than the refractive index of the fourth inorganic insulating layer.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The invention will now be described more fully hereinafter with reference to the accompanying drawings, in which embodiments of the invention are shown. This invention may, however, be embodied in different forms and should not necessarily be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers may indicate the same components throughout the specification and the drawings.

It will be understood that, although the terms "first," "second," etc. may be used herein to describe various elements, these elements should not necessarily be limited by these terms. These terms are used to distinguish one element from another element. For instance, a first element discussed below could be termed a second element without departing from the teachings of the invention. Similarly, the second element could also be termed the first element.

Hereinafter, embodiments of the present disclosure will be described with reference to the accompanying drawings.

Figure 1:
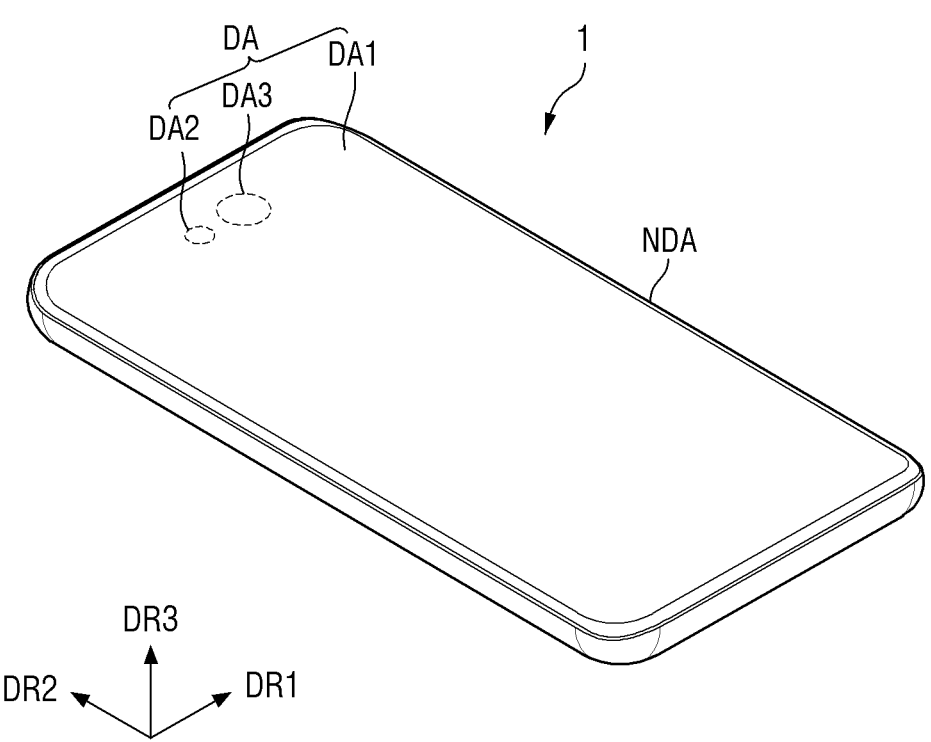
FIG. 1 is a perspective view of an electronic device according to an embodiment.

FIG. 1 is a schematic plan view of a display device according to an embodiment.

Referring to FIG. 1, an electronic device 1 displays a moving image or a still image. The electronic device 1 may refer to any electronic device that provides a display screen. For example, electronic device 1 may include televisions, laptop computers, computer monitors, billboards, Internet of things devices, mobile phones, smartphones, tablet personal computers (PCs), electronic watches, smartwatches, watch phones, head mounted displays, mobile communication terminals, electronic notebooks, electronic books, portable multimedia players (PMPs), navigation, game consoles, digital cameras, camcorders, and the like that provide the display screen.

The electronic device 1 may include a display device ('10' in FIG. 2) that includes a display screen. Examples of the display device may include an inorganic light emitting diode display device, an organic light emitting display device, a quantum dot light emitting display device, a plasma display device, and a field emission display device. Hereinafter, it is illustrated that an organic light emitting diode display device is used as an example of the display device, but the present disclosure is not necessarily limited thereto. Any display device may also be used as long as the same technical idea is applicable.

A shape of the electronic device 1 may be variously changed. For example, the electronic device 1 may have a shape such as a rectangle with a longer width than length, a rectangle with a longer length than width, a square, a quadrilateral with rounded corners (vertices), other polygons, or a circle. A shape of a display area DA of the electronic device 1 may also be similar to an overall shape of the electronic device 1. In FIG. 1, the electronic device 1 having a rectangular shape with a longer length in a second direction DR2 than width in the first direction D1 is illustrated.

The electronic device 1 may include a display area DA and a non-display area NDA. The display area DA is an area in which an image may be displayed, and the non-display area NDA is an area in which no image is displayed. The display area DA may also be referred to as an active area, and the non-display area NDA may also be referred to as a non-active area. The display area DA may generally occupy the center of the electronic device 1.

The display area DA may include a first display area DA1, a second display area DA2, and a third display area DA3. The second display area DA2 and the third display area DA3, which are areas in which components for adding various functions to the electronic device 1 are disposed, may correspond to a component area.

Figure 2:
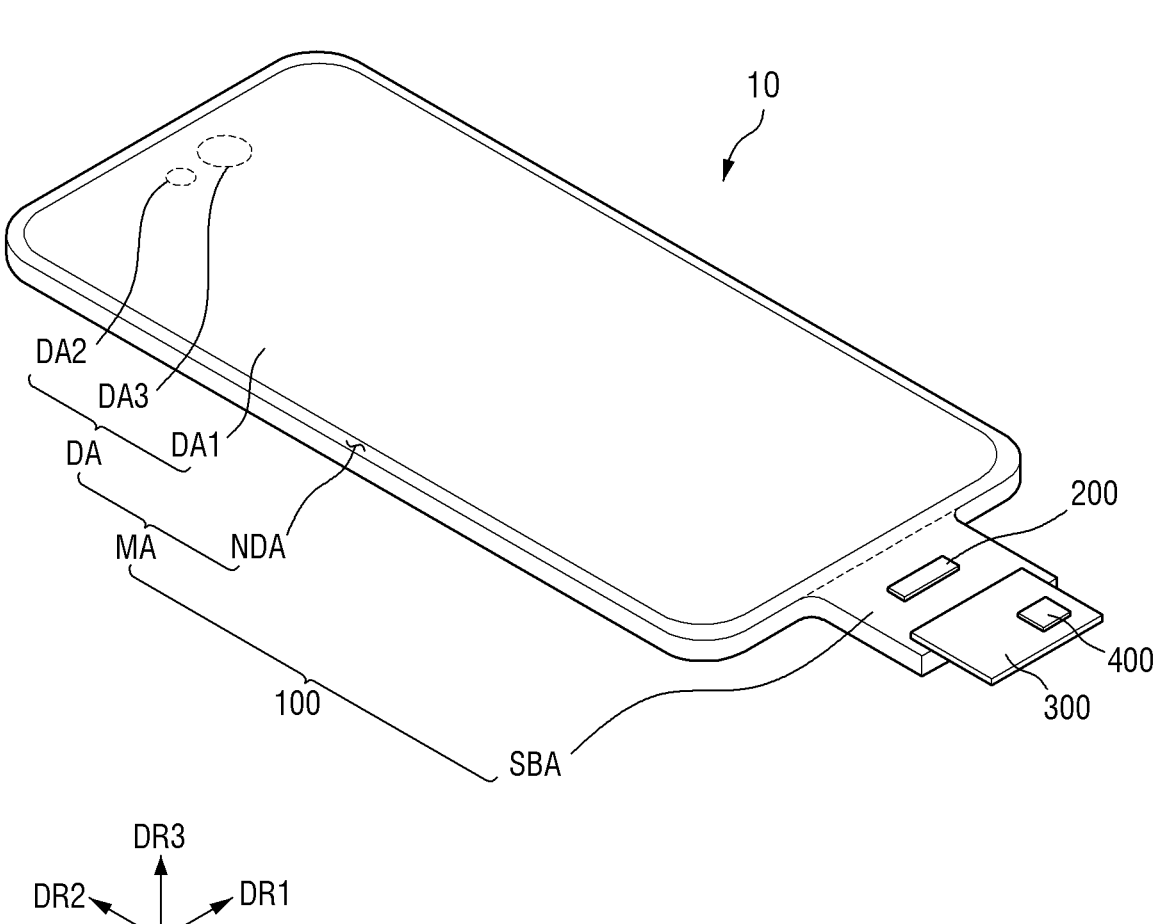
FIG. 2 is a perspective view illustrating a display device included in the electronic device according to an embodiment.

FIG. 2 is a perspective view illustrating a display device included in the electronic device according to an embodiment.

Referring to FIG. 2, the electronic device 1, according to an embodiment, may include a display device 10. The display device 10 may provide a screen displayed by the electronic device 1. The display device 10 may have a planar shape similar to that of the electronic device 1. For example, the display device 10 may have a shape similar to a rectangle having a pair of short side extending in a first direction DR1 and a pair of long side extending in a second direction DR2. A corner where a short side extending in the first direction DR1 and a long side extending in the second direction DR2 meet may be rounded to have a predetermined curvature, but the invention is not necessarily limited thereto and the corner may also be formed at a right angle. The planar shape of the display device 10 is not necessarily limited to the quadrilateral, and may be formed similarly to other polygons, circles, or ovals.

The display device 10 may include a display panel 100, a display driving unit 200, a circuit board 300, and a touch driving unit 400.

The display panel 100 may include a main area MA and a sub-area SBA.

The main area MA may include a display area DA including pixels displaying an image, and a non-display area NDA at least partially surrounding the display area DA. The display area DA may include a first display area DA1, a second display area DA2, and a third display area DA3. The display area DA may emit light from a plurality of light emitting areas or a plurality of opening areas. For example, the display panel 100 may include a pixel circuit including switching elements, a pixel defining film defining the light emitting area or the opening area, and a self-light emitting element.

The self-light emitting element may include an organic light emitting diode (LED) including an organic light emitting layer, a quantum dot LED including a quantum dot light emitting layer, an inorganic LED including an inorganic semiconductor, and/or a micro LED, but the present invention is not necessarily limited thereto.

The non-display area NDA may be an area outside of the display area DA. The non-display area NDA may be defined as an edge area of the main area MA of the display panel 100. The non-display area NDA may include a gate driving unit supplying gate signals to gate lines, and fan-out lines connecting the display driving unit 200 and the display area DA.

The sub-area SBA may be an area extending from one side of the main area MA. The sub-area SBA may include a flexible material that may be bent, folded, rolled, or the like. For example, when the sub-area SBA is bent, the sub-area SBA may overlap the main area MA in a thickness direction (e.g., a third direction DR3). The sub-area SBA may include the display driving unit 200 and a pad portion connected to a circuit board 300. In an embodiment, the sub-area SBA may be omitted, and the display driving unit 200 and the pad portion may be disposed in the non-display area NDA.

The display driving unit 200 may output signals and voltages for driving the display panel 100. The display driving unit 200 may supply data voltages to data lines. The display driving unit 200 may supply a power voltage to a power line and may supply a gate control signal to a gate driving unit. The display driving unit 200 may be formed as an integrated circuit (IC) and mounted on the display panel 100 by a chip on glass (COG) method, a chip on plastic (COP) method, or an ultrasonic bonding method. For example, the display driving unit 200 may be disposed in the sub-area SBA, and may overlap the main area MA in the thickness direction by bending of the sub-area SBA. As an example, the display driving unit 200 may be mounted on the circuit board 300.

The circuit board 300 may be attached onto the pad portion of the display panel 100 using an anisotropic conductive film (ACF). Lead lines of the circuit board 300 may be electrically connected to the pad portion of the display panel 100. The circuit board 300 may be a flexible film such as a flexible printed circuit board, a printed circuit board, or a chip on film.

The touch driving unit 400 may be mounted on the circuit board 300. The touch driving unit 400 may be connected to a touch sensing unit of the display panel 100. The touch driving unit 400 may supply a touch driving signal to a plurality of touch electrodes of the touch sensing unit, and may sense an amount of change in capacitance between the plurality of touch electrodes. For example, the touch driving signal may be a pulse signal having a predetermined frequency. The touch driving unit 400 may calculate whether an input is made and input coordinates based on the amount of change in capacitance between the plurality of touch electrodes. The touch driving unit 400 may be formed as an integrated circuit (IC).

Figure 3:
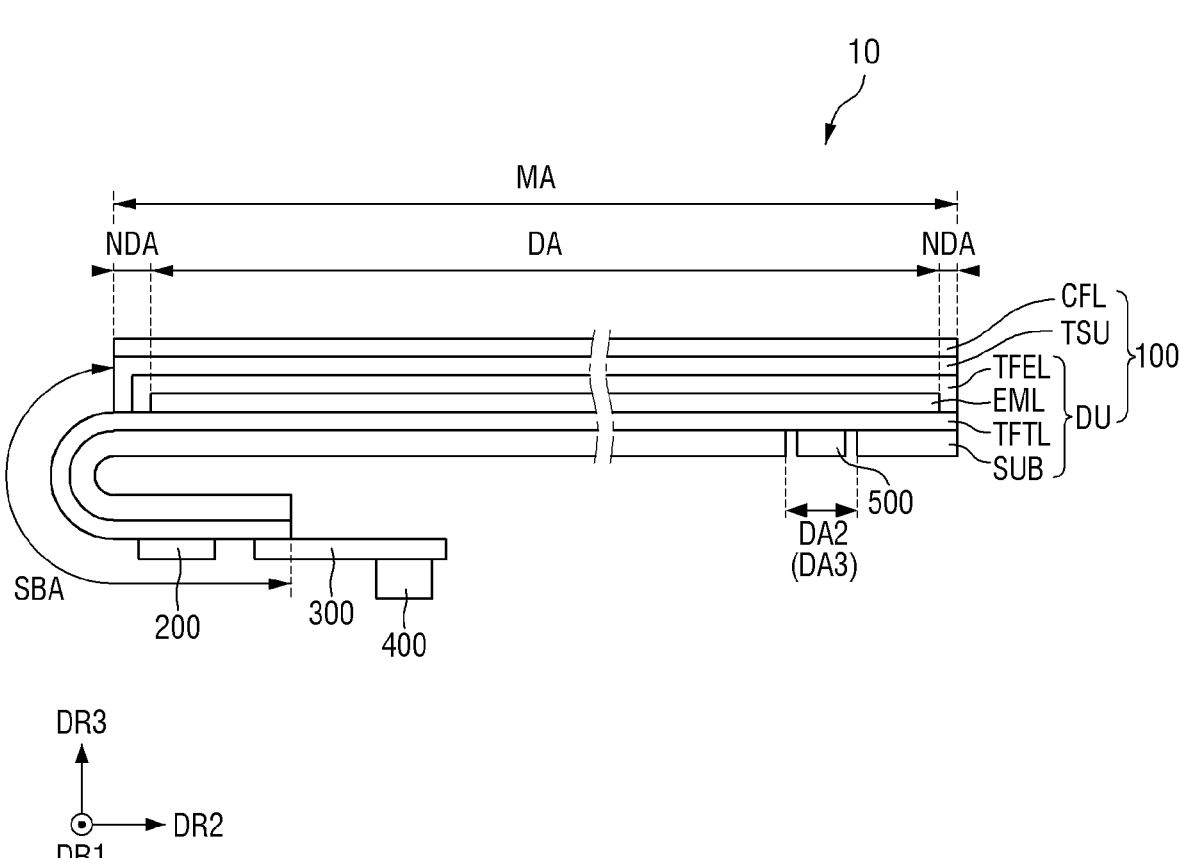
FIG. 3 is a cross-sectional view of the display device of FIG. 2 viewed from a side surface.

FIG. 3 is a cross-sectional view of the display device of FIG. 2 viewed from a side surface.

Referring to FIG. 3, the display panel 100 may include a display layer DU, a touch sensing layer TSU, and a color filter layer CFL. The display layer DU may include a substrate SUB, a thin film transistor layer TFTL, a light emitting element layer EML, and a thin film encapsulation layer TFEL.

The substrate SUB may be a base substrate or a base member. The substrate SUB may be a flexible substrate that may be bent, folded, rolled, or the like. For example, the substrate SUB may include a polymer resin such as polyimide PI, but is not necessarily limited thereto. In an embodiment, the substrate SUB may include a glass material or a metal material.

The thin film transistor layer TFTL may be disposed on the substrate SUB. The thin film transistor layer TFTL may include a plurality of thin film transistors constituting a pixel circuit of pixels. The thin film transistor layer TFTL may further include gate lines, data lines, power lines, gate control lines, fan-out lines connecting the display driving unit 200 and the data lines, and lead lines connecting the display driving unit 200 and the pad portion. Each of the thin film transistors may include a semiconductor area, a source electrode, a drain electrode, and a gate electrode. For example, when the gate driving unit is formed on one side of the non-display area NDA of the display panel 100, the gate driving unit may include the thin film transistors.

The thin film transistor layer TFTL may be disposed in the display area DA, the non-display area NDA, and the sub-area SBA. The thin film transistors, the gate lines, the data lines, and the power lines of each of the pixels of the thin film transistor layer TFTL may be disposed in the display area DA. The gate control lines and the fan-out lines of the thin film transistor layer TFTL may be disposed in the non-display area NDA. The lead lines of the thin film transistor layer TFTL may be disposed in the sub-area SBA.

The light emitting element layer EML may be disposed on the thin film transistor layer TFTL. The light emitting element layer EML may include a plurality of light emitting elements including a first electrode, a second electrode, and a light emitting layer emitting light, and a pixel defining film defining pixels. The plurality of light emitting elements of the light emitting element layer EML may be disposed in the display area DA.

In an embodiment, the light emitting layer may be an organic light emitting layer including an organic material. The light emitting layer may include a hole transporting layer, an organic light emitting layer, and an electron transporting layer. When the first electrode receives a voltage through the thin film transistor of the thin film transistor layer TFTL and the second electrode receives a cathode voltage, holes and electrons may move to the organic light emitting layer through the hole transporting layer and the electron transporting layer, respectively, and may be combined with each other in the organic light emitting layer to emit light.

In an embodiment, the light emitting element may include a quantum dot light emitting diode including a quantum dot light emitting layer, an inorganic light emitting diode including an inorganic semiconductor, or a micro light emitting diode.

The thin film encapsulation layer TFEL may cover an upper surface and side surfaces of the light emitting element layer EML, and may protect the light emitting element layer EML. The thin film encapsulation layer TFEL may include at least one inorganic film and at least one organic film for encapsulating the light emitting element layer EML.

The touch sensing layer TSU may be disposed on the thin film encapsulation layer TFEL. The touch sensing layer TSU may include a plurality of touch electrodes for detecting a user's touch in a capacitance method, and touch lines connecting the plurality of touch electrodes and the touch driving unit 400. For example, the touch sensing layer TSU may sense the user's touch in a mutual capacitance method or a self-capacitance method.

In an embodiment, the touch sensing layer TSU may be disposed on a separate substrate disposed on the display layer DU. In this case, the substrate supporting the touch sensing layer TSU may be a base member that encapsulates the display layer DU.

The plurality of touch electrodes of the touch sensing layer TSU may be disposed in a touch sensor area overlapping the display area DA. The touch lines of the touch sensing layer TSU may be disposed in a touch peripheral area overlapping the non-display area NDA.

The color filter layer CFL may be disposed on the touch sensing layer TSU. The color filter layer CFL may include a plurality of color filters corresponding to each of the plurality of light emitting areas. Each of the color filters may selectively transmit light of a specific wavelength and may block or absorb light of a different wavelength. The color filter layer CFL may absorb a portion of light introduced from the outside of the display device 10 to reduce reflected light caused by external light. Therefore, the color filter layer CFL may prevent color distortion caused by reflection of external light.

As the color filter layer CFL is disposed directly on the touch sensing layer TSU, the display device 10 might not require a separate substrate for the color filter layer CFL. Therefore, a thickness of the display device 10 may be relatively small.

In some embodiments, the display device 10 may further include an optical device 500. The optical device 500 may be disposed in the second display area DA2 or the third display area DA3. The optical device 500 may emit or receive light in infrared, ultraviolet, and/or visible light bands. For example, the optical device 500 may be an optical sensor that detects light incident on the display device 10, such as a proximity sensor, an illuminance sensor, and a camera sensor or an image sensor.

Figure 4:
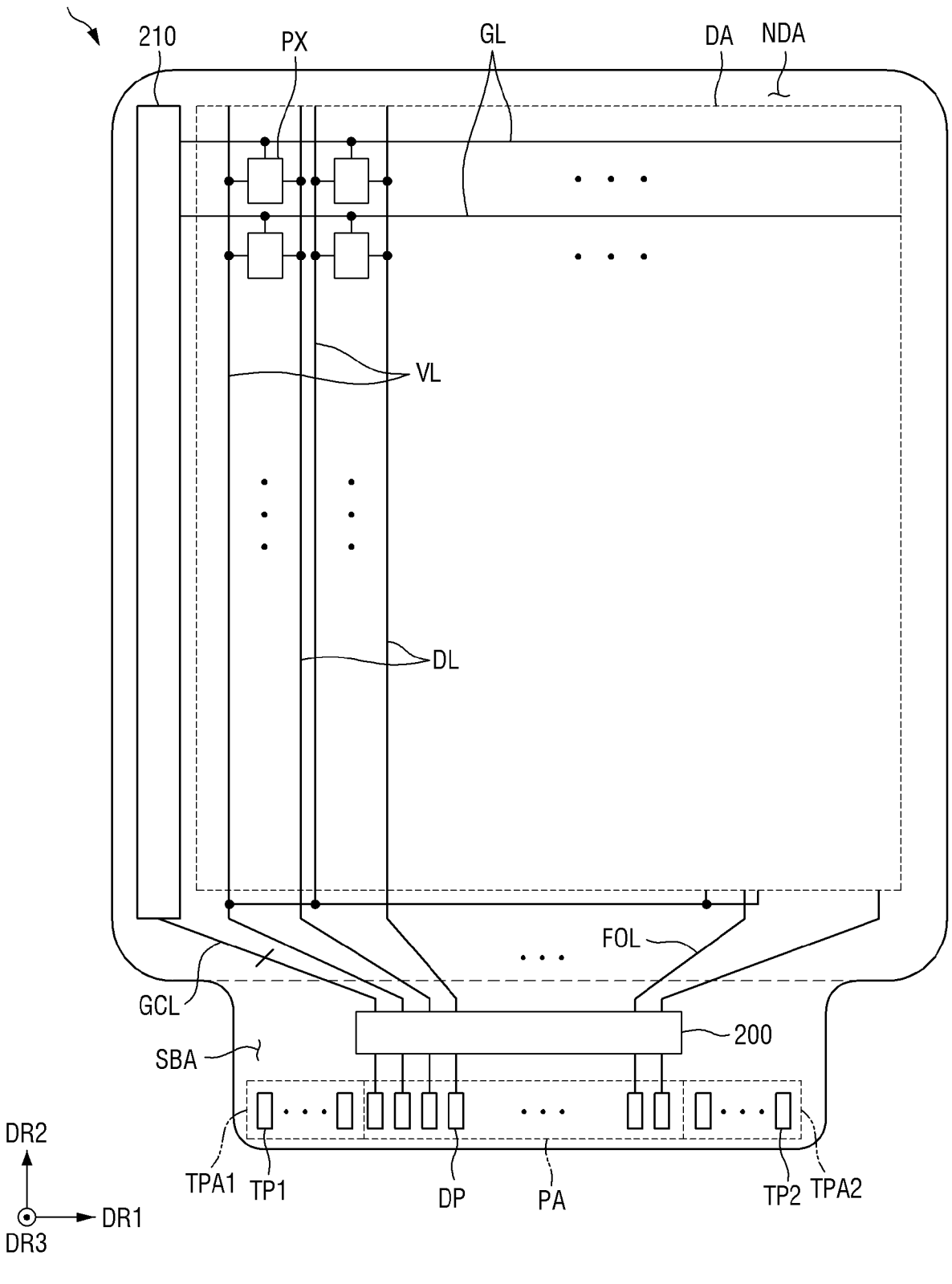
FIG. 4 is a plan view illustrating a display layer of the display device according to an embodiment.

FIG. 4 is a plan view illustrating a display layer of the display device according to an embodiment.

Referring to FIG. 4, the display layer DU may include a display area DA and a non-display area NDA.

The display area DA may be disposed at the center of the display panel 100. A plurality of pixels PX, a plurality of gate lines GL, a plurality of data lines DL, and a plurality of power lines VL may be disposed in the display area DA. Each of the plurality of pixels PX may be defined as a minimum unit emitting light.

The plurality of gate lines GL may supply a gate signal received from a gate driving unit 210 to the plurality of pixels PX. The plurality of gate lines GL may extend in the first direction DR1 and may be spaced apart from each other in the second direction DR2 intersecting the first direction DR1.

The plurality of data lines DL may supply the data voltages received from the display driving unit 200 to the plurality of pixels PX. The plurality of data lines DL may extend in the second direction DR2 and may be spaced apart from each other in the first direction DR1.

The plurality of power lines VL may supply the power voltage received from the display driving unit 200 to the plurality of pixels PX. Here, the power voltage may be a driving voltage, an initialization voltage, a reference voltage, and/or a low potential voltage. The plurality of power lines VL may extend in the second direction DR2 and may be spaced apart from each other in the first direction DR1.

The non-display area NDA may at least partially surround the display area DA. A gate driving unit 210, fan-out lines FOL, and gate control lines GCL may be disposed in the non-display area NDA. The gate driving unit 210 may generate a plurality of gate signals based on the gate control signal, and may sequentially supply the plurality of gate signals to the plurality of gate lines GL according to a set order.

The fan-out lines FOL may extend from the display driving unit 200 to the display area DA. The fan-out lines FOL may supply the data voltages received from the display driving unit 200 to the plurality of data lines DL.

The gate control line GCL may extend from the display driving unit 200 to the gate driving unit 210. The gate control line GCL may supply the gate control signal received from the display driving unit 200 to the gate driving unit 210.

The sub-area SBA may include a display driving unit 200, a pad area PA, and first and second touch pad areas TPA1 and TPA2.

The display driving unit 200 may output signals and voltages for driving the display panel 100 to the fan-out lines FOL. The display driving unit 200 may supply the data voltage to the data lines DL through the fan-out lines FOL. The data voltage may be supplied to the plurality of pixels PX and may control luminance of the plurality of pixels PX. The display driving unit 200 may supply the gate control signal to the gate driving unit 210 through the gate control line GCL.

The pad area PA, the first touch pad area TPA1, and the second touch pad area TPA2 may be disposed at an edge of the sub-area SBA. The pad area PA, the first touch pad area TPA1, and the second touch pad area TPA2 may be electrically connected to the circuit board 300 using an anisotropic conductive film or a material such as a self assembly anisotropic conductive paste (SAP).

The pad area PA may include a plurality of display pad portions DP. The plurality of display pad portions DP may be connected to a graphic system through the circuit board 300. The plurality of display pad portions DP may be connected to the circuit board 300 to receive digital video data, and may supply the digital video data to the display driving unit 200.

Figure 5:
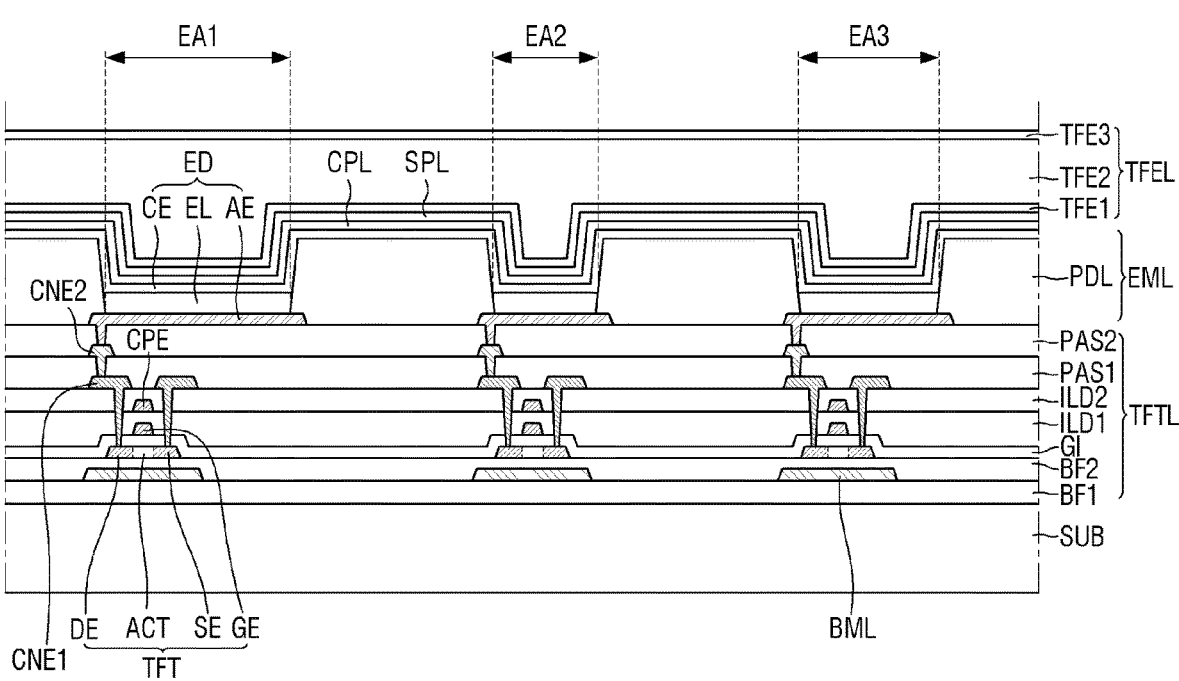
FIG. 5 is a cross-sectional view illustrating a portion of the display device according to an embodiment.

FIG. 5 is a cross-sectional view illustrating a portion of the display device according to an embodiment. FIG. 5 is a partial cross-sectional view of the display device 10 and illustrates cross-sections of the substrate SUB, the thin film transistor layer TFTL, the light emitting element layer EML, and the thin film encapsulation layer TFEL of the display layer DU.

Referring to FIG. 5, the substrate SUB may be a base substrate or a base member. The substrate SUB may be a flexible substrate that may be bent, folded, rolled, or the like. For example, the substrate SUB may include a polymer resin such as polyimide PI, but is not necessarily limited thereto. As an example, the substrate SUB may include a glass material or a metal material.

The thin film transistor layer TFTL may include a first buffer layer BF1, a lower metal layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic film capable of preventing permeation of air or moisture. For example, the first buffer layer BF1 may include a plurality of stacked inorganic films.

The lower metal layer BML may be disposed on the first buffer layer BF1. For example, the lower metal layer BML may be formed as a single layer or multiple layers made of molybdenum (Mo), aluminum (Al), chromium (Cr), gold (Au), titanium (Ti), nickel (Ni), neodymium (Nd), and/or copper (Cu), or an alloy thereof.

The second buffer layer BF2 may cover the first buffer layer BF1 and the lower metal layer BML. The second buffer layer BF2 may include an inorganic film capable of preventing permeation of air or moisture. For example, the second buffer layer BF2 may include a plurality of stacked inorganic films.

The thin film transistor TFT may be disposed on the second buffer layer BF2, and may constitute a pixel circuit of each of the plurality of pixels. For example, the thin film transistor TFT may be a driving transistor or a switching transistor of the pixel circuit. The thin film transistor TFT may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML and the gate electrode GE in the thickness direction, and may be insulated from the gate electrode GE by the gate insulating layer GI. In a portion of the semiconductor layer ACT, a material of the semiconductor layer ACT may become a conductor to form the source electrode SE and the drain electrode DE.

The gate electrode GE may be disposed on the gate insulating layer GI. The gate electrode GE may overlap the semiconductor layer ACT with the gate insulating layer GI interposed therebetween.

The gate insulating layer GI may be disposed on the semiconductor layer ACT. For example, the gate insulating layer GI may cover the semiconductor layer ACT and the second buffer layer BF2, and may insulate the semiconductor layer ACT and the gate electrode GE from each other. The gate insulating layer GI may include a contact hole through which the first connection electrode CNE1 penetrates.

The first interlayer insulating layer ILD1 may cover the gate electrode GE and the gate insulating layer GI. The first interlayer insulating layer ILD1 may include a contact hole through which the first connection electrode CNE1 penetrates. The contact hole of the first interlayer insulating layer ILD1 may be connected to the contact hole of the gate insulating layer GI and a contact hole of the second interlayer insulating layer ILD2.

The capacitor electrode CPE may be disposed on the first interlayer insulating layer ILD1. The capacitor electrode CPE may overlap the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 penetrates. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the thin film transistor TFT and the second connection electrode CNE2 to each other. The first connection electrode CNE1 may be inserted into the contact holes formed in the second interlayer insulating layer ILD2, the first interlayer insulating layer ILD1, and the gate insulating layer GI to be in contact with the drain electrode DE of the thin film transistor TFT.

The first passivation layer PAS1 may cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 penetrates.

The second connection electrode CNE2 may be disposed on the first passivation layer PAS1. The second connection electrode CNE2 may electrically connect the first connection electrode CNE1 and a pixel electrode AE of a light emitting element ED to each other. The second connection electrode CNE2 may be inserted into the contact hole formed in the first passivation layer PAS1 to be in contact with the first connection electrode CNE1.

The second passivation layer PAS2 may cover the second connection electrode CNE2 and the first passivation layer PAS1. The second passivation layer PAS2 may include a contact hole through which the pixel electrode AE of the light emitting element ED penetrates.

The light emitting element layer EML may be disposed on the thin film transistor layer TFTL. The light emitting element layer EML may include light emitting elements ED and a pixel defining film PDL. The light emitting element ED may include a pixel electrode AE, a light emitting layer EL, and a common electrode CE.

The pixel electrode AE may be disposed on the second passivation layer PAS2. The pixel electrode AE may overlap any one of openings OPE1, OPE2, and OPE3 of the pixel defining film PDL. The pixel electrode AE may be electrically connected to the drain electrode DE of the thin film transistor TFT through the first and second connection electrodes CNE1 and CNE2.

The light emitting layer EL may be disposed on the pixel electrode AE. For example, the light emitting layer EL may be an organic light emitting layer made of an organic material, but is not necessarily limited thereto. In the case in which the light emitting layer EL corresponds to the organic light emitting layer, when the thin film transistor TFT applies a predetermined voltage to the pixel electrode AE of the light emitting element ED and the common electrode CE of the light emitting element ED receives a common voltage or a cathode voltage, each of the holes and electrons may move to the light emitting layer EL through the hole transporting layer and the electron transporting layer, and the holes and electrons may combine with each other in the light emitting layer EL to emit light.

The common electrode CE may be disposed on the light emitting layer EL. For example, the common electrode CE may be implemented in the form of an electrode common to all pixels without being divided for each of the plurality of pixels. The common electrode CE may be disposed on the light emitting layer EL in first to third light emitting areas EA1, EA2, and EA3, and may be disposed on the pixel defining film PDL in an area excluding the first to third light emitting areas EA1, EA2, and EA3.

The common electrode CE may receive a common voltage or a low potential voltage. In the case in which the pixel electrode AE receives a voltage corresponding to the data voltage and the common electrode CE receives the low potential voltage, as a potential difference is formed between the pixel electrode AE and the common electrode CE, the light emitting layer EL may emit light.

The pixel defining film PDL may include a plurality of openings OPE1, OPE2, and OPE3, and may be disposed on the second passivation layer PAS2 and a portion of the pixel electrode AE. The pixel defining film PDL may include a first opening OPE1, a second opening OPE2, and a third opening OPE3, and each of the openings OPE1, OPE2, and OPE3 may expose a portion of the pixel electrode AE. As described above, each of the openings OPE1, OPE2, and OPE3 of the pixel defining film PDL may define the first to third light emitting areas EA1, EA2, and EA3, and the first to third light emitting areas EA1, EA2, and EA3 may have different areas or sizes. The pixel defining film PDL may separate and insulate the pixel electrodes AE of the plurality of light emitting elements ED from each other. The pixel defining film PDL may include a light absorbing material to prevent light reflection. For example, the pixel defining film PDL may include a polyimide (PI)-based binder and a pigment in which red, green, and blue colors are mixed. Alternatively, the pixel defining film PDL may include a cardo-based binder resin and a mixture of lactam black pigment and blue pigment. Alternatively, the pixel defining film PDL may include carbon black.

The capping layer CPL may be disposed on the common electrode CE. The capping layer CPL may include at least one inorganic film to prevent oxygen or moisture from permeating into the light emitting element layer EML. In an embodiment, the capping layer CPL may include aluminum oxide, titanium oxide, tantalum oxide, hafnium oxide, zinc oxide, silicon oxide, silicon nitride, and/or silicon oxynitride.

An auxiliary layer SPL may be disposed on the capping layer CPL. As will be described later, the auxiliary layer SPL together with the capping layer CPL may serve as an optical layer capable of increasing light efficiency of the light emitting element ED or controlling viewing angle characteristics thereof. In an embodiment, the auxiliary layer SPL may include lithium fluoride (LiF), aluminum oxide, titanium oxide, tantalum oxide, hafnium oxide, zinc oxide, silicon oxide, silicon nitride, and/or silicon oxynitride.

The thin film encapsulation layer TFEL may be disposed on the auxiliary layer SPL and may cover the plurality of light emitting elements ED. The thin film encapsulation layer TFEL may include at least one inorganic film to prevent oxygen or moisture from permeating into the light emitting element layer EML. The thin film encapsulation layer TFEL may include at least one organic film to protect the light emitting element layer EML from foreign substances such as dust.

In an embodiment, the thin film encapsulation layer TFEL may include a first encapsulation layer TFEL1, a second encapsulation layer TFEL2, and a third encapsulation layer TFEL3. The first encapsulation layer TFEL1 and the third encapsulation layer TFEL3 may each be an inorganic encapsulation layer, and the second encapsulation layer TFEL2 disposed therebetween may be an organic encapsulation layer.

Each of the first encapsulation layer TFEL1 and the third encapsulation layer TFEL3 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The second encapsulation layer TFEL2 may include a polymer-based material. Examples of suitable polymer-based material may include an acrylic resin, an epoxy-based resin, polyimide, polyethylene, and the like. For example, the second encapsulation layer TFEL2 may include an acrylic resin, for example, polymethyl methacrylate or polyacrylic acid. The second encapsulation layer TFEL2 may be formed by curing a monomer or applying a polymer.

Figure 6:
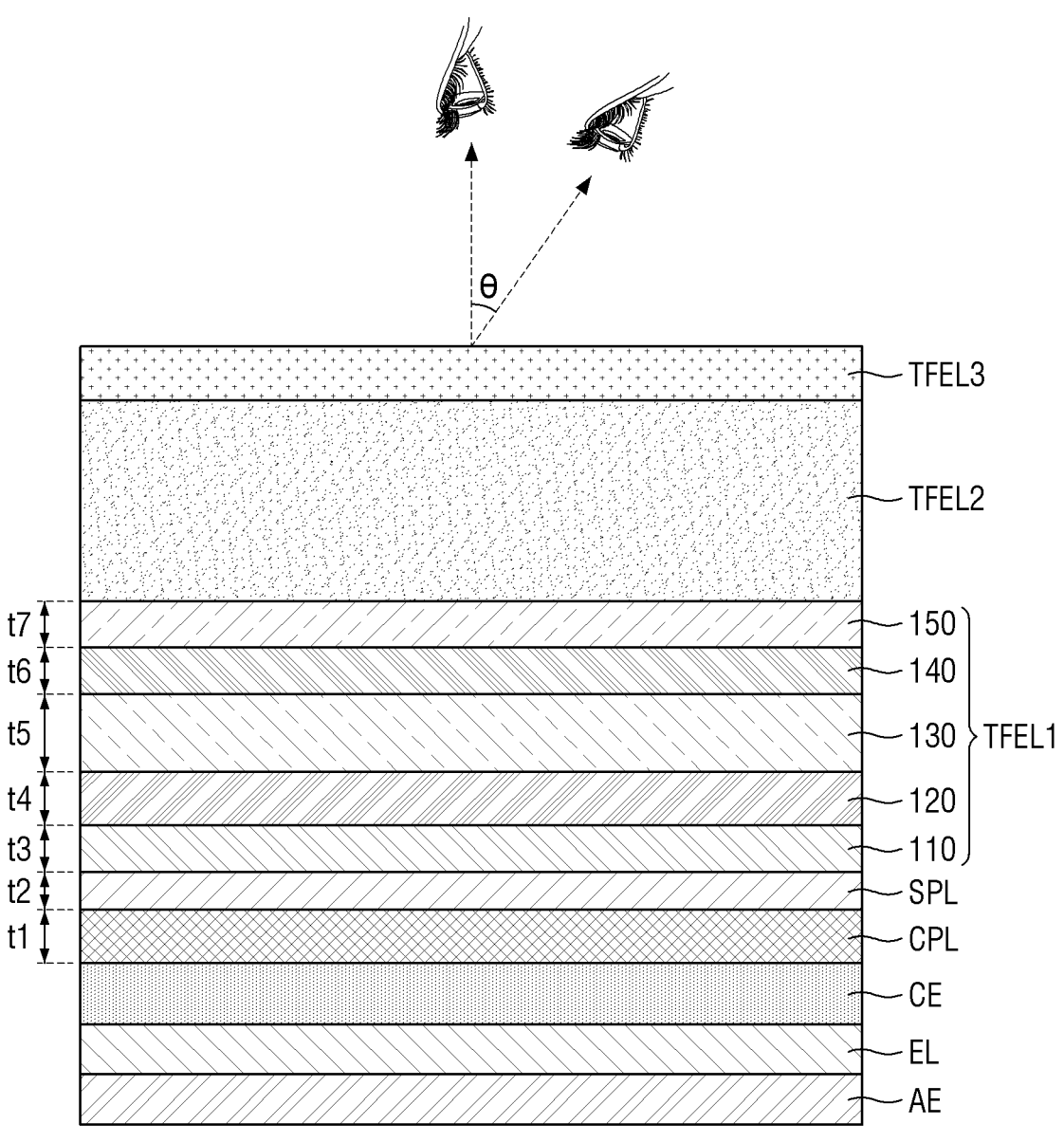
FIG. 6 is a cross-sectional view illustrating in more detail a stacked structure of a light emitting element and an encapsulation layer of the display device according to an embodiment.

FIG. 6 is a cross-sectional view illustrating, in more detail, a stacked structure of a light emitting element and an encapsulation layer of the display device according to an embodiment.

Referring to FIG. 6, the display device 10 may include a structure in which the light emitting element ED and a plurality of inorganic or organic films disposed thereon are stacked. For example, the display device 10 may include the capping layer CPL, the auxiliary layer SPL, the first encapsulation layer TFEL1, the second encapsulation layer TFEL2, and the third encapsulation layer TFEL3 sequentially disposed on the common electrode CE of the light emitting element ED. Each of the capping layer CPL disposed directly on the light emitting element ED and the auxiliary layer SPL disposed thereon may include an inorganic insulating material, but may have different materials or different refractive indices and thicknesses. Light emitted from the light emitting element ED is emitted through the capping layer CPL and the auxiliary layer SPL, and as the capping layer CPL and the auxiliary layer SPL have different refractive indices, light may be reflected at an interface the capping layer CPL and the auxiliary layer SPL. The display device 10 may control light efficiency (or light output efficiency) and viewing angle characteristics of the light emitting element ED as desired by disposing optical layers capable of reflecting light on the light emitting element ED using layers having different refractive indices. The display device 10 may include more optical layers using other layers in addition to the capping layer CPL and the auxiliary layer SPL.

According to an embodiment, in the display device 10, the first encapsulation layer TFEL1 may include a plurality of inorganic insulating layers 110, 120, 130, 140, and 150, and in addition to the capping layer CPL and the auxiliary layer SPL, the plurality of inorganic insulating layers 110, 120, 130, 140, and 150 may reflect light at interfaces between the various layers, thereby serving as optical layers. The first encapsulation layer TFEL1 may include a first inorganic insulating layer 110, a second inorganic insulating layer 120, a third inorganic insulating layer 130, a fourth inorganic insulating layer 140, and a fifth inorganic insulating layer 150 sequentially disposed on the auxiliary layer SPL. The layers sequentially disposed from the capping layer CPL to the fifth inorganic insulating layer 150 may include different materials and have different refractive indices and thicknesses. Light emitted from the light emitting element ED pass through the fifth inorganic insulating layer 150 from the capping layer CPL and is emitted in an upward direction, and the light may be partially and repeatedly reflected and refracted while passing through the interface of the layers having different refractive indices and may be emitted. By adjusting the refractive index and thickness of each layer disposed on the light emitting element ED, light output efficiency and viewing angle characteristics of the light emitted from the light emitting element ED may be controlled to desired conditions.

Hereinafter, as the optical layers disposed on the light emitting element ED, the capping layer CPL, the auxiliary layer SPL, and the plurality of inorganic insulating layers 110, 120, 130, 140, and 150 of the first encapsulation layer TFEL1 will be described.

The capping layer CPL may include silicon oxide (SiOx), silicon nitride (SiNx), and/or silicon oxynitride (SiOxNy). The capping layer CPL may have a refractive index n1 in a range of 1.60 to 2.30 and a thickness t1 in a range of 500 Å to 1500 Å. As an example, the capping layer CPL may have the refractive index n1 of 1.97 and the thickness t1 of 850 Å or 700 Å.

According to an embodiment, in the display device 10, the plurality of inorganic insulating layers disposed on the capping layer CPL may include an insulating layer having a relatively high refractive index and an insulating layer having a relatively low refractive index. The inorganic insulating layers disposed in contact with each other, among the plurality of inorganic insulating layers, may have different refractive indices. The plurality of inorganic insulating layers may have a structure in which an inorganic insulating layer having a high refractive index and an inorganic insulating layer having a low refractive index are stacked on each other. For example, the capping layer CPL may be a high refractive index layer having a relatively high refractive index, and the auxiliary layer SPL disposed thereon may be a low refractive index layer having a relatively low refractive index. The first inorganic insulating layer 110 of the first encapsulation layer TFEL1 may be a high refractive index layer, and the second inorganic insulating layer 120 thereof may be a low refractive index layer. Each of the third inorganic insulating layer 130 and the fourth inorganic insulating layer 140 may be a medium refractive index layer having a refractive index having a value between the refractive index of the first inorganic insulating layer 110 and the refractive of the second inorganic insulating layer 120.

The auxiliary layer SPL may include lithium fluoride (LiF), silicon oxide (SiOx), silicon nitride (SiNx), and/or silicon oxynitride (SiOxNy). The auxiliary layer SPL may be disposed on the capping layer CPL and may have a lower refractive index than that of the capping layer CPL. For example, the auxiliary layer SPL may have a refractive index n2 in a range of 1.20 to 1.62 and a thickness t2 in a range of 200 Å to 1400 Å. In an embodiment, the auxiliary layer SPL may have the thickness t2 of 400 Å and may have the refractive index n2 of 1.39 because of including lithium fluoride (LiF). In an embodiment, the auxiliary layer SPL may have the thickness t2 of 400 Å and may have the refractive index n2 of 1.48 or 1.57 because of including silicon oxynitride (SiOxNy).

The first inorganic insulating layer 110 may include silicon oxide (SiOx), silicon nitride (SiNx), and/or silicon oxynitride (SiOxNy). The first inorganic insulating layer 110 may be disposed on the auxiliary layer SPL and may have a refractive index that is greater than that of the auxiliary layer SPL. For example, the first inorganic insulating layer 110 may have a refractive index n3 in a range of 1.70 to 2.00 and a thickness t3 in a range of 400 Å to 3500 Å. In an embodiment, the first inorganic insulating layer 110 may include silicon nitride (SiNx), and may have the refractive index n3 of 1.89 and the thickness t3 of any one of 1300 Å, 1500 Å, and 1600 Å.

The second inorganic insulating layer 120 may include silicon oxide (SiOx), silicon nitride (SiNx), and/or silicon oxynitride (SiOxNy). The second inorganic insulating layer 120 may be disposed on the first inorganic insulating layer 110 and have a smaller refractive index than that of the first inorganic insulating layer 110. For example, the second inorganic insulating layer 120 may have a refractive index n4 in a range of 1.20 to 1.62 and a thickness t4 in a range of 200 Å to 2400 Å. In an embodiment, the second inorganic insulating layer 120 may include silicon oxynitride (SiOxNy), and may have the refractive index n4 of 1.48 and the thickness t4 of any one of 400 Å, 1400 Å, and 1550 Å.

The above-described capping layer CPL, auxiliary layer SPL, first inorganic insulating layer 110, and second inorganic insulating layer 120 may be layers that have a major influence on optical characteristics of the display device 10. The layers may need to be finely adjusted in thickness and refractive index thereof in order to achieve a target resonance characteristic for each wavelength. The thickness and refractive index ranges of each layer may be ranges designed to have optical characteristics targeted by the display device 10.

The third inorganic insulating layer 130 may include silicon oxide (SiOx), silicon nitride (SiNx), and/or silicon oxynitride (SiOxNy). The third inorganic insulating layer 130 may be disposed on the second inorganic insulating layer 120 and have a refractive index that is greater than or equal to that of the second inorganic insulating layer 120.

For example, the third inorganic insulating layer 130 may have a refractive index n5 in a range of 1.48 to 1.89 and a thickness t5 of 4000 Å or more. In an embodiment, the third inorganic insulating layer 130 may include silicon oxynitride (SiOxNy) and may have the refractive index n5 of 1.57, 1.62, and 1.77, and the thickness t5 of 7300 Å. The third inorganic insulating layer 130 may be a layer having a relatively small influence on the optical characteristics in the first encapsulation layer TFEL1, and may be a layer for securing reliability such as moisture permeation and oxidation prevention. Accordingly, the third inorganic insulating layer 130 may have a relatively large thickness t5 (e.g., 4000 Å or more).

The fourth inorganic insulating layer 140 may include silicon oxide (SiOx), silicon nitride (SiNx), and/or silicon oxynitride (SiOxNy). The fourth inorganic insulating layer 140 may be disposed on the third inorganic insulating layer 130 and may have a refractive index equal to or smaller than that of the third inorganic insulating layer 130. For example, the fourth inorganic insulating layer 140 may have a refractive index n6 in a range of 1.52 to 1.70 and a thickness t6 in a range of 300 Å to 1000 Å. In an embodiment, the fourth inorganic insulating layer 140 may include silicon oxynitride (SiOxNy), and have the refractive index n6 of 1.57 and the thickness t6 of 700 Å. The fourth inorganic insulating layer 140 may have a thickness such that reflections that occur at the interface with the third inorganic insulating layer 130 and the interface with the fifth inorganic insulating layer 150 may destructively interfere with each other.

The fifth inorganic insulating layer 150 may include 0-rich silicon oxide (SiOx), silicon nitride (SiNx), and/or silicon oxynitride (SiOxNy). In an embodiment, the fifth inorganic insulating layer 150 may include 0-rich silicon oxynitride (SiOxNy). The fifth inorganic insulating layer 150 may have a refractive index n7 of 1.52 and a thickness t7 of 800 Å.

In an embodiment, the refractive index n6 of the fourth inorganic insulating layer 140 may satisfy the condition of Equation 1 below.

$$\min(n5,n7)+|n5\text{-}n7|\times0.25<n6<\min(n5,n7)+|n5\text{-}n7|\times0.75 \qquad \text{[Equation 1]}$$

Here, n5 is the refractive index of the third inorganic insulating layer 130, n7 is the refractive index of the fifth inorganic insulating layer 150, min(n5, n7) represents a minimum value among n5 and n7, and |n5-n7| represents an absolute value of a difference between n5 and n7.

The second encapsulation layer TFEL2 may be an organic insulating layer. The second encapsulation layer TFEL2 may have a refractive index in a range of 1.8 to 1.9.

The third encapsulation layer TFEL3 may include silicon oxide (SiOx), silicon nitride (SiNx), and/or silicon oxynitride (SiOxNy). The third encapsulation layer TFEL3 may have a refractive index of 1.49.

In the display device 10, the thicknesses of the capping layer CPL, the auxiliary layer SPL, and the plurality of inorganic insulating layers 110, 120, 130, 140, and 150 of the first encapsulation layer TFEL1 may be designed in a specific range by optical characteristics, reliability, and TACT time. In the inorganic insulating layer, as the refractive index thereof is high and the thickness thereof is increased, the reliability characteristics due to moisture permeability are increased, but the TACT time may increase, an optical absorption may increase, and a dispersion of the thickness may increase. For example, when an optical cavity length is increased, it may be difficult to secure a cavity characteristic as an optical path becomes longer than a coherent length or a high-order cavity is used. Furthermore, since final optical characteristics change according to a spectrum of the light as the light passes through the plurality of layers in the display device 10, it may be required to finely adjust the thickness and refractive index of the inorganic insulating layer so that the cavity characteristics for each wavelength may be adjusted according to the material of the inorganic insulating layer.

The display device 10 may have the structure in which the capping layer CPL, the auxiliary layer SPL, the first inorganic insulating layer 110, the second inorganic insulating layer 120, and the third inorganic insulating layer 130 are sequentially stacked, and the layers having high and low refractive indices may be stacked from the capping layer CPL to the third inorganic insulating layer 130. As the plurality of layers having different refractive indices are sequentially stacked, an interface capable of refracting or reflecting light may be formed at the interface between the layers in which the capping layer CPL, the auxiliary layer SPL, the first inorganic insulating layer 110, the second inorganic insulating layer 120, and the third inorganic insulating layer 130 are disposed to be in contact with each other. For example, as the first inorganic insulating layer 110, the second inorganic insulating layer 120, and the third inorganic insulating layer 130 each includes silicon nitride (SiNx), silicon oxide (SiOx), and silicon oxynitride (SiOxNy) and have different refractive indices, it is possible to form a plurality of reflective interfaces together with the capping layer CPL and the auxiliary layer SPL. The display device 10 according to an embodiment may control the light efficiency of the light emitting element ED, or the light output efficiency and the viewing angle characteristics of the light emitted from the light emitting element ED as desired by including the stacked structure of the layers having different refractive indices as described above.

Figure 7:
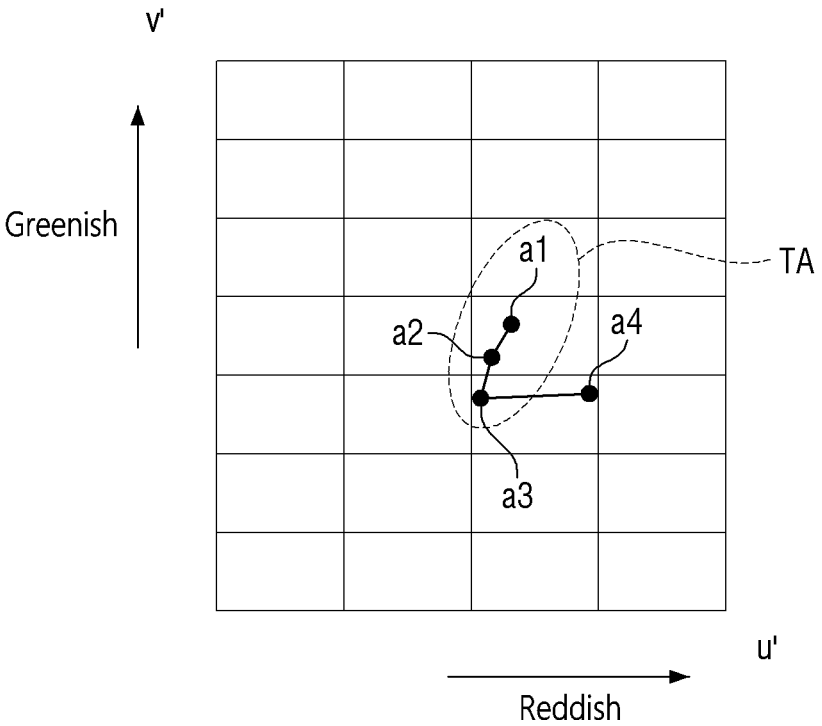
FIG. 7 is a view illustrating a CIE 1976 coordinate system of a change in white color for each viewing angle of the display device of FIG. 6.

FIG. 7 is a view illustrating a CIE 1976 coordinate system of a change in white color for each viewing angle of the display device of FIG. 6.

FIG. 7 illustrates CIE 1976 color coordinates (u', v') showing color changes for each viewing angle. A horizontal axis of the CIE 1976 color coordinates may represent a u' coordinate, and a vertical axis thereof may represent a v' coordinate. A reddish phenomenon may occur as a color coordinate value at a specific angle moves to the right from the u' coordinate, and a greenish phenomenon may occur as a color coordinate value at a predetermined angle moves to an upper side from the v' coordinate.

Referring to FIG. 7, in the display device 10, according to an embodiment, when the display device 10 is viewed from different angles a1, a2, a3, and a4, color coordinate values of the light emitted from the display device 10 may move. For example, the color coordinate value of the display device 10 viewed from the angle a1 may be different from the color coordinate values of the display device 10 viewed from the angles a2, a3, and a4. The difference in color coordinate values may cause a color shift according to a viewing angle at which the display device 10 is viewed, because the light emitted from the light emitting element ED is refracted and reflected by the capping layer CPL, the auxiliary layer SPL, and the thin film encapsulation layer TFEL and is emitted. Here, the fact that the difference in color coordinate values viewed from different angles a2, a3, and a4 with respect to a color coordinate value viewed from a specific angle, for example, the angle a1 is not large may mean that the color shift of the light emitted from the display device is not large depending on an angle from which the display device 10 is viewed.

The display device 10 may measure the degree of color shifting according to the viewing angle according to the coordinate values on the CIE 1976 color coordinates (u', v') when the display device 10 is viewed at 0° (a1), 30° (a2), 45° (a3), and 60° (a4). As the capping layer CPL, the auxiliary layer SPL, and the first to fifth inorganic insulating layers 110, 120, 130, 140, and 150 are sequentially stacked and are stacked as a layer with a high refractive index and a layer with a low refractive index, the display device 10 may further reduce a dispersion of a movement trajectory in a color temperature direction in the CIE 1976 coordinate system. Alternatively, the display device 10 may minimize the change in coordinate values according to the viewing angle on the CIE 1976 color coordinates (u', v').

As illustrated in FIG. 7, on the CIE 1976 color coordinates (u', v'), the u' coordinate values and the v' coordinate values at the angles a2 and a3 may be smaller than the u' coordinate value and the v' coordinate value at the angle a1, respectively, and the u' coordinate value at the angle a4 may be greater than the u' coordinate value at the angle a1, but the v' coordinate value at the angle a4 may be smaller than the v' coordinate value at the angle a1.

In the display device 10, the u' coordinate values and the v' coordinate values at the angles a2 and a3, which are relatively low angles, may be smaller than the u' coordinate value and the v' coordinate value at the angle a1, and the reddish and greenish phenomena may be reduced at the angles a2 and a3. In addition, the u' coordinate value at the angle a4, which is a relatively high angle, may be greater the u' coordinate value at the angle a1, but the v' coordinate value at the angle a4 may be smaller than the v' coordinate value at the angle a1, and the greenish phenomenon may be reduced at the angle a4. Further, in the display device 10, most of the CIE 1976 coordinate values at the angles a1 to a4 may be located within or very close to a target coordinate range TA. For example, the display device 10 according to an embodiment may greatly reduce the dispersion of the movement trajectory in the color temperature direction in the CIE 1976 coordinate system and control the dispersion within a desired region.

Figure 8:
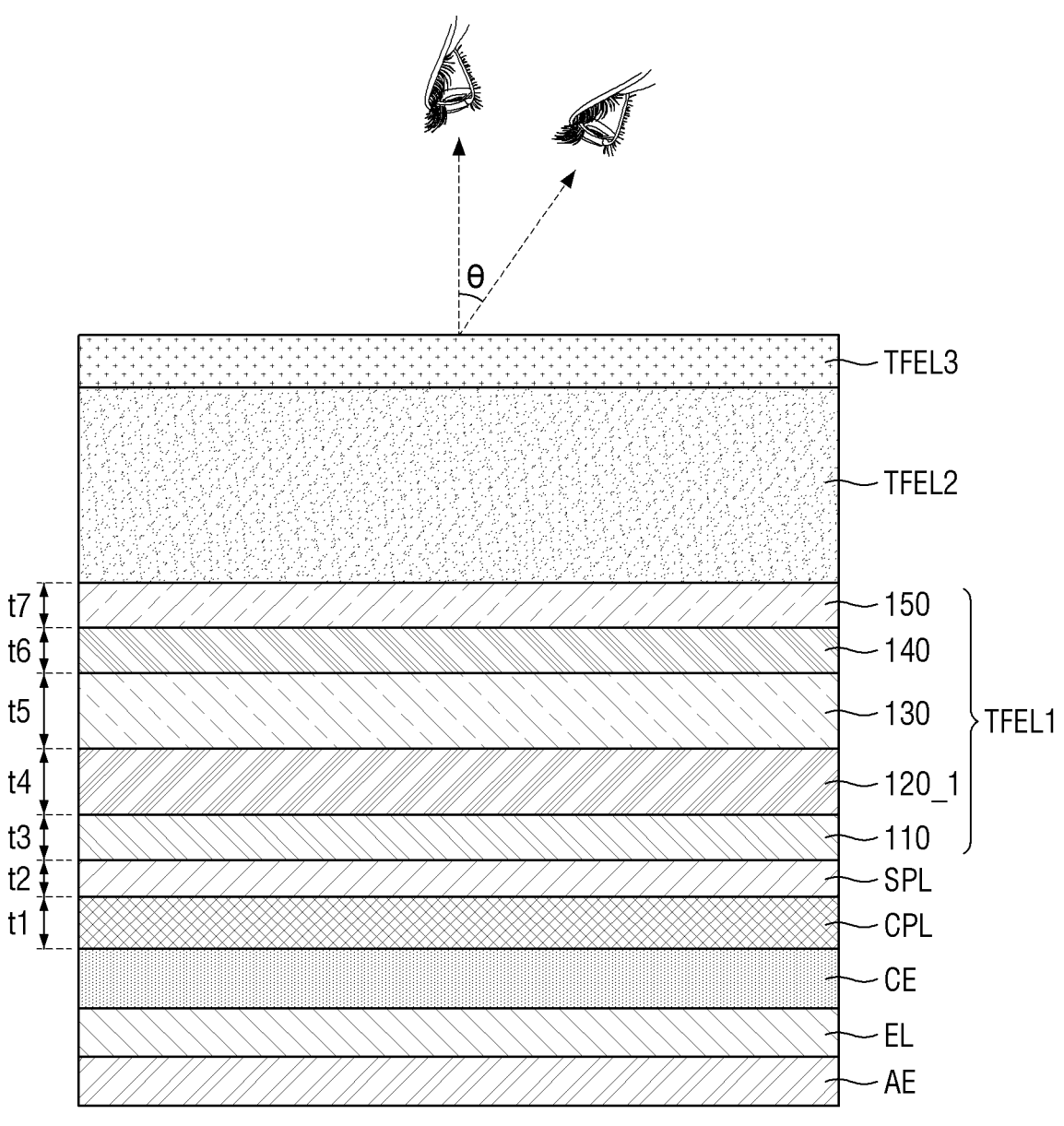
FIG. 8 is a cross-sectional view illustrating, in more detail, a stacked structure of a light emitting element and an encapsulation layer of a display device according to an embodiment.
Figure 9:
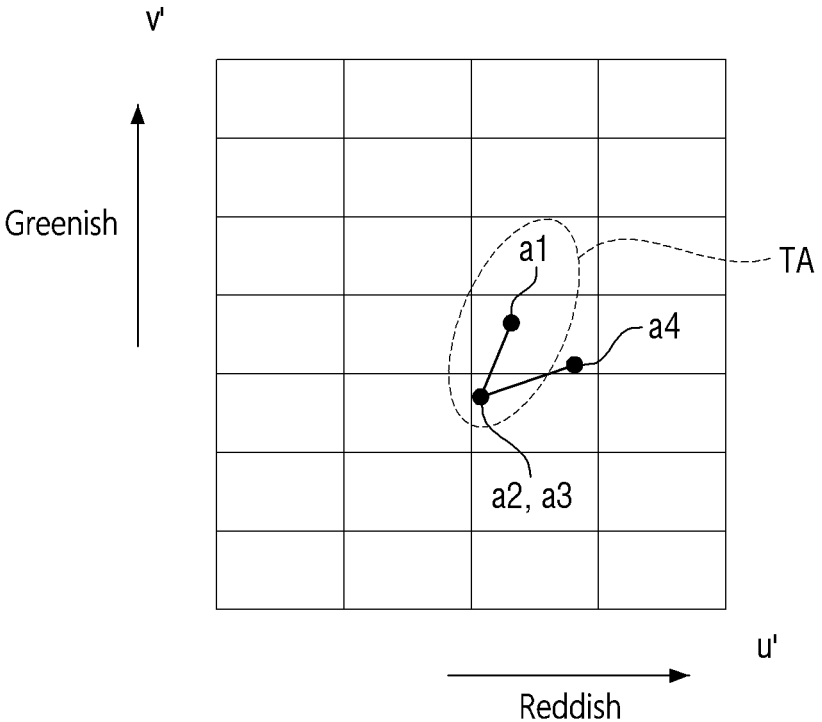
FIG. 9 is a view illustrating a CIE 1976 coordinate system of a change in white color for each viewing angle of the display device of FIG. 8.

FIG. 8 is a cross-sectional view illustrating, in more detail, a stacked structure of a light emitting element and an encapsulation layer of a display device according to an embodiment. FIG. 9 is a view illustrating a CIE 1976 coordinate system of a change in white color for each viewing angle of the display device of FIG. 8.

Referring to FIGS. 8 and 9, the display device 10, according to an embodiment, may have a thickness t4 of a second inorganic insulating layer 120_1 of the first encapsulation layer TFEL1 thicker than that of the display device 10 of FIGS. 6 and 7, and a thickness of the capping layer CPL thicker than that of the display device 10 of FIGS. 6 and 7. The display device 10, according to the present embodiment, may be the same as the display device 10 of FIGS. 6 and 7 except that the thickness t4 of the second inorganic insulating layer 120_1 and the thickness t1 of the capping layer CPL are different from those of the embodiment of FIGS. 6 and 7. However, the thickness t4 of the second inorganic insulating layer 120_1 and the thickness t1 of the capping layer CPL may be adjusted within the above-described ranges, respectively.

For example, the display device 10 may have the thickness t4 of the second inorganic insulating layer 120_1 of 1550 Å and the thickness t1 of the capping layer CPL of 770 Å. In addition, the thicknesses of the auxiliary layer SPL, the first inorganic insulating layer 110, and the third inorganic insulating layer 130 to the fifth inorganic insulating layer 150 may be the same as those described above.

The display device 10 may further reduce the dispersion of the movement trajectory in the color temperature direction in the CIE 1976 coordinate system by adjusting the thicknesses of the capping layer CPL and the second inorganic insulating layer 120_1. As illustrated in FIG. 9, on the CIE 1976 color coordinates (u', v'), the u' coordinate values and the v' coordinate values at the angles a2 and a3 may be smaller than the u' coordinate value and the v' coordinate value at the angle a1, respectively, and the u' coordinate value at the angle a4 may be greater than the u' coordinate value at the angle a1, but the v' coordinate value at the angle a4 may be smaller than the v' coordinate value at the angle a1.

In the display device 10, the u' coordinate values and the v' coordinate values at the angles a2 and a3, which are relatively low angles, may be smaller than the u' coordinate value and the v' coordinate value at the angle a1, and the reddish and greenish phenomena may be reduced at the angles a2 and a3. In addition, the u' coordinate value at the angle a4, which is a relatively high angle, may be greater the u' coordinate value at the angle a1, but the v' coordinate value at the angle a4 may be smaller than the v' coordinate value at the angle a1, and the greenish phenomenon may be reduced at the angle a4. Further, in the display device 10 according to the present embodiment, most of the CIE 1976 coordinate values at the angles a1 to a4 may be located within or very close to a target coordinate range TA. According to an embodiment, the display device 10 may greatly reduce the dispersion of the movement trajectory in the color temperature direction in the CIE 1976 coordinate system and control the dispersion within a desired region by adjusting the thicknesses and refractive indices of the plurality of inorganic insulating layers.

Figure 10:
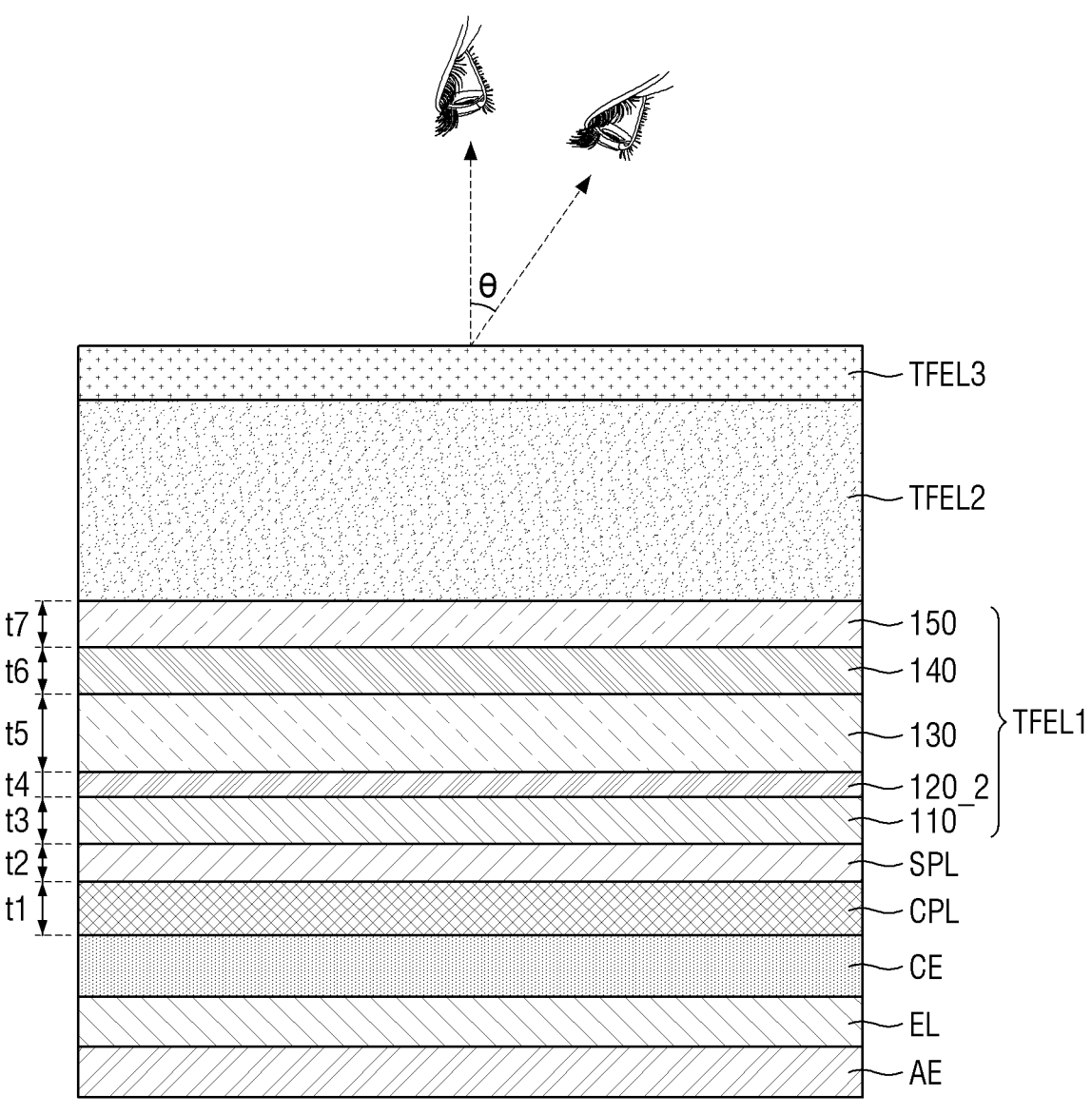
FIG. 10 is a cross-sectional view illustrating in more detail a stacked structure of a light emitting element and an encapsulation layer of a display device according to an embodiment.
Figure 11:
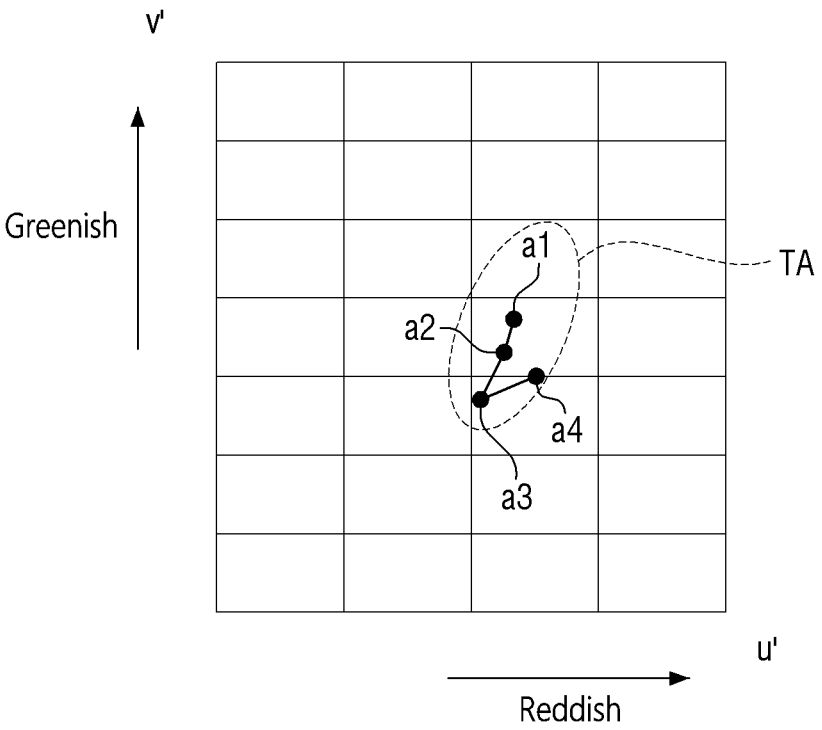
FIG. 11 is a view illustrating a CIE 1976 coordinate system of a change in white color for each viewing angle of the display device of FIG. 10.

FIG. 10 is a cross-sectional view illustrating, in more detail, a stacked structure of a light emitting element and an encapsulation layer of a display device according to an embodiment. FIG. 11 is a view illustrating a CIE 1976 coordinate system of a change in white color for each viewing angle of the display device of FIG. 10.

Referring to FIGS. 10 and 11, the display device 10, according to an embodiment, may have a thickness t3 of a first inorganic insulating layer 110_2 of the first encapsulation layer TFEL1 thicker than that of the display device 10 of FIGS. 6 and 7, and a thickness t4 of the second inorganic insulating layer 120_3 thicker than that of the display device 10 of FIGS. 6 and 7. The display device 10, according to the present embodiment, may be the same as the display device 10 of FIGS. 6 and 7 except that the thickness t3 of the first inorganic insulating layer 110_2 and the thickness t4 of the second inorganic insulating layer 120_2 are different from those of the embodiment of FIGS. 6 and 7. However, the thickness t3 of the first inorganic insulating layer 110_2 and the thickness t4 of the second inorganic insulating layer 120_2 may be adjusted within the above-described ranges, respectively.

For example, the display device 10 may have the thickness t3 of the first inorganic insulating layer 110_2 of 1500 Å and the thickness t4 of the second inorganic insulating layer 120_2 of 400 Å. In addition, the thicknesses of the capping layer CPL, the auxiliary layer SPL, and the third inorganic insulating layer 130 to the fifth inorganic insulating layer 150 may be the same as those described above.

The display device 10 may further reduce the dispersion of the movement trajectory in the color temperature direction in the CIE 1976 coordinate system by adjusting the thicknesses of the first inorganic insulating layer 110_2 and the second inorganic insulating layer 120_2. As illustrated in FIG. 11, on the CIE 1976 color coordinates (u', v'), the u' coordinate value and the v' coordinate value at the angle a2 may be smaller than the u' coordinate value and the v' coordinate value at the angle a1, respectively, and the u' coordinate value and the v' coordinate value at the angle a3 may also be smaller than the u' coordinate values and the v' coordinate values at the angles a1 and a2. The u' coordinate value at the angle a4 may be greater than the u' coordinate values at the angles a1 to a3, but the v' coordinate value at the angle a4 may be smaller than the v' coordinate value at the angles a1 and a2.

In the display device 10, the u' coordinate values and the v' coordinate values at the angles a2 and a3, which are relatively low angles, may be smaller than the u' coordinate value and the v' coordinate value at the angle a1, and the reddish and greenish phenomena may be reduced at the angles a2 and a3. In addition, the u' coordinate value at the angle a4, which is a relatively high angle, may be greater the u' coordinate value at the angle a1, but the v' coordinate value at the angle a4 may be smaller than the v' coordinate value at the angle a1, and the greenish phenomenon may be reduced at the angle a4. Further, in the display device 10 according to the present embodiment, the CIE 1976 coordinate values at the angles a1 to a4 may be located within a target coordinate range TA. According to an embodiment, the display device 10 may greatly reduce the dispersion of the movement trajectory in the color temperature direction in the CIE 1976 coordinate system and control the dispersion within a desired region by adjusting the thicknesses and refractive indices of the plurality of inorganic insulating layers.

Figure 12:
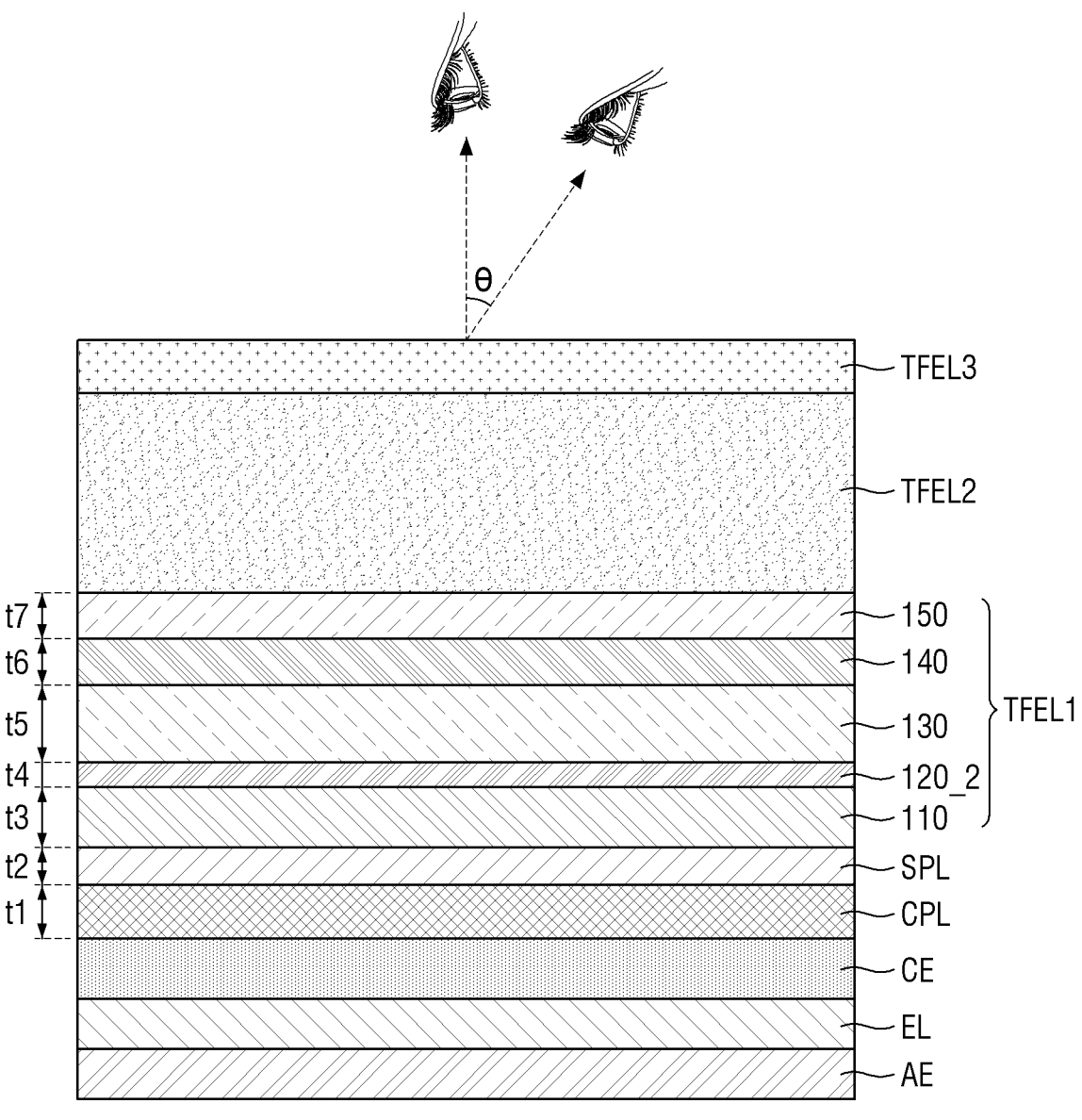
FIG. 12 is a cross-sectional view illustrating in more detail a stacked structure of a light emitting element and an encapsulation layer of a display device according to an embodiment.
Figure 13:
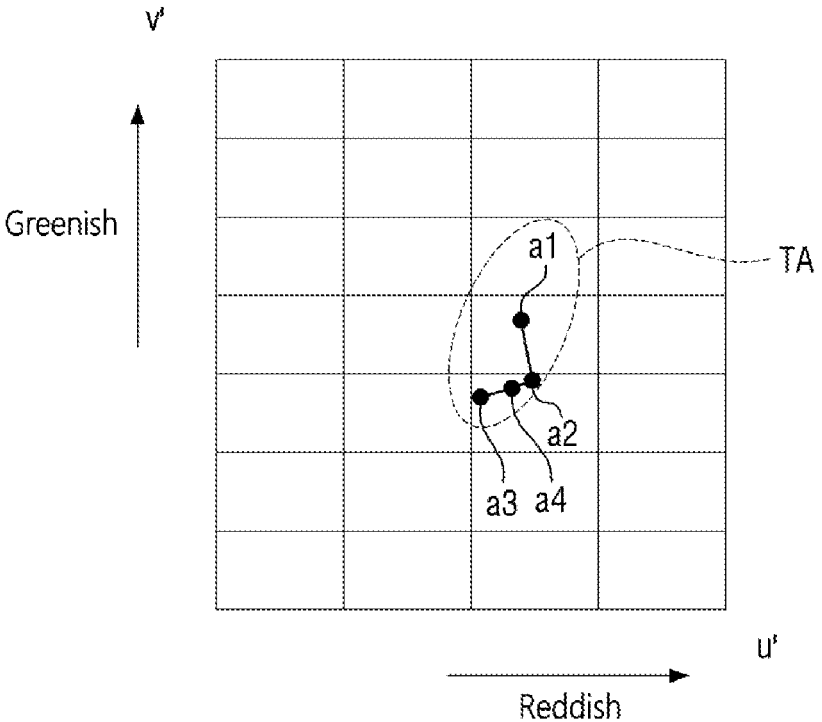
FIG. 13 is a view illustrating a CIE 1976 coordinate system of a change in white color for each viewing angle of the display device of FIG. 12.

FIG. 12 is a cross-sectional view illustrating, in more detail, a stacked structure of a light emitting element and an encapsulation layer of a display device according to an embodiment. FIG. 13 is a view illustrating a CIE 1976 coordinate system of a change in white color for each viewing angle of the display device of FIG. 12.

Referring to FIGS. 12 and 13, the display device 10, according to an embodiment, may have a thickness t3 of a first inorganic insulating layer 110_3 of the first encapsulation layer TFEL1 that is thicker than that of the display device 10 of FIGS. 10 and 11, and a thickness t1 of the capping layer CPL that is thinner than that of the display device 10 of FIGS. 10 and 11. The display device 10, according to the present embodiment, may be the same as the display device 10 of FIGS. 10 and 11 except that the thickness t3 of the first inorganic insulating layer 110_3 and the thickness t1 of the capping layer CPL are different from those of the embodiment of FIGS. 10 and 11. However, the thickness t3 of the first inorganic insulating layer 110_3 and the thickness t1 of the capping layer CPL may be adjusted within the above-described ranges, respectively.

For example, the display device 10 may have the thickness t3 of the first inorganic insulating layer 110_3 of 1600 Å and the thickness t1 of the capping layer CPL of 750 Å. In addition, the thicknesses of the auxiliary layer SPL and the second inorganic insulating layer 120 to the fifth inorganic insulating layer 150 may be the same as those described above.

The display device 10 may further reduce the dispersion of the movement trajectory in the color temperature direction in the CIE 1976 coordinate system by adjusting the thickness of the first inorganic insulating layer 110_3. As illustrated in FIG. 13, on the CIE 1976 color coordinates (u', v'), the u' coordinate value at the angle a2 may be greater than the u' coordinate value at the angle a1, but the v' coordinate value at the angle a2 may be smaller than the v' coordinate value at the angle a1. The u' coordinate value and the v' coordinate value at the angle a3 may be smaller than the coordinate values at the angle a1 and the angle a2, respectively. The u' coordinate value and the v' coordinate value at the angle a4 may be smaller than the coordinate values at the angle a1 and the angle a2, respectively, but may be greater than the coordinate values at the angle a3.

In the display device 10, the v' coordinate values at the angles a2 to a4 may be smaller than that at the angle a1, and the greenish phenomenon may be greatly reduced at the angles a2 to a4. The u' coordinate value at the angle a2, which is a relatively low angle, may be greater than that at the angle a1, but a difference therebetween may be small compared to an amount of change in the v' coordinate value. In addition, the u' coordinate values at the angles a3 and a4 may be smaller than the u' coordinate values at the angles a1 and a2, and the reddish phenomenon may be reduced at the angles a3 and a4. Further, in the display device 10, according to the present embodiment, the CIE 1976 coordinate values at the angles a1 to a4 may be located within a target coordinate range TA, and the dispersion of the movement trajectory thereof may be greatly reduced. According to an embodiment, the display device 10 may greatly reduce the dispersion of the movement trajectory in the color temperature direction in the CIE 1976 coordinate system and control the dispersion within a desired region by adjusting the thicknesses and refractive indices of the plurality of inorganic insulating layers.

Figure 14:
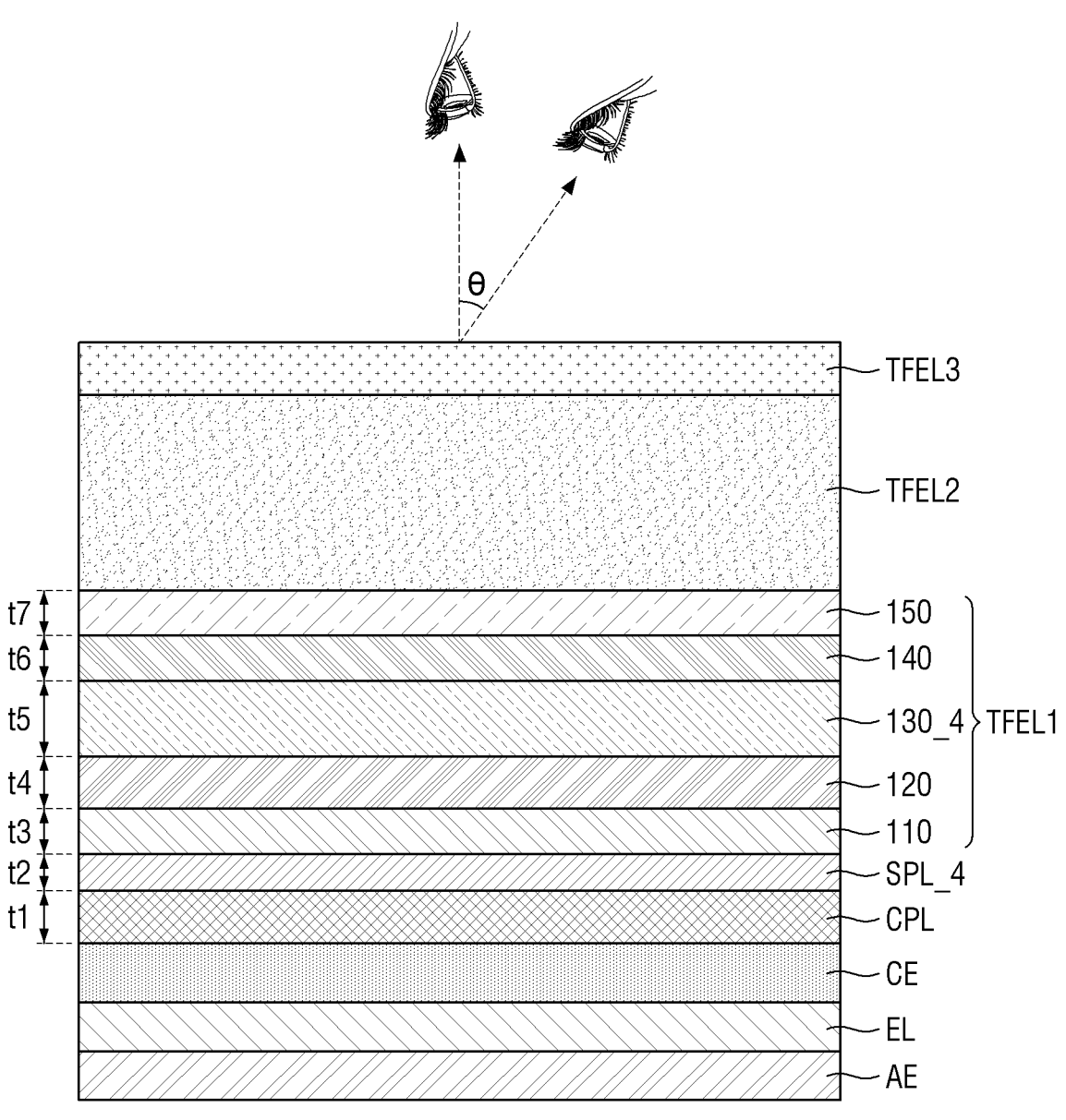
FIGS. 14 and 15 are cross-sectional views illustrating, in more detail, a stacked structure of a light emitting element and an encapsulation layer of a display device according to an embodiment.
Figure 15:
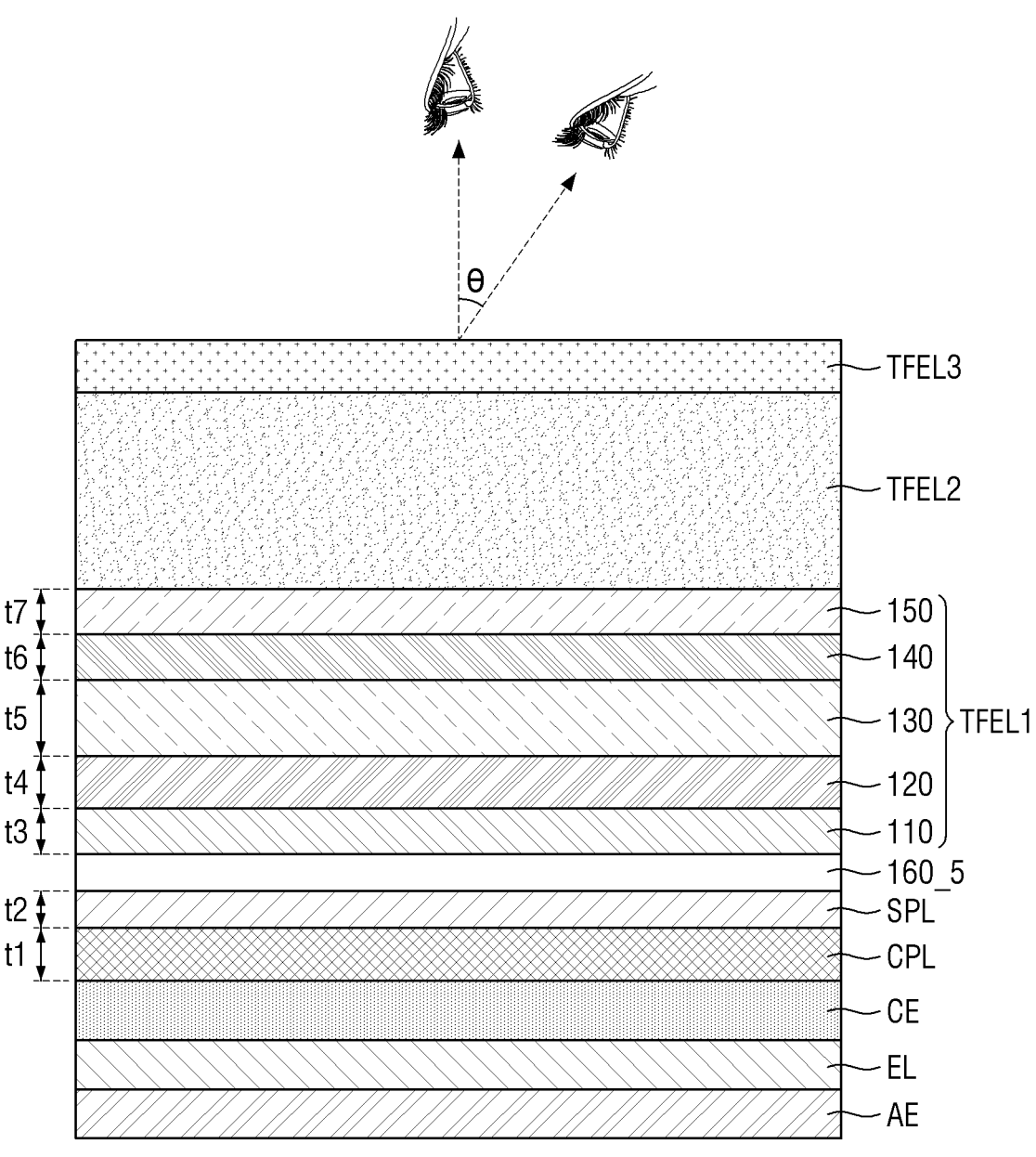

FIGS. 14 and 15 are cross-sectional views illustrating, in more detail, a stacked structure of a light emitting element and an encapsulation layer of a display device according to an embodiment.

Referring to FIG. 14, the display device 10, according to an embodiment, may be different from the embodiment of FIG. 6 in a material and a refractive index of an auxiliary layer SPL_4 and a refractive index of a third inorganic insulating layer 130_4. For example, the auxiliary layer SPL_4 may include silicon oxynitride (SiOxNy), and have a refractive index n2 of 1.48 or 1.57. The third inorganic insulating layer 130_4 may include silicon oxide (SiOx), silicon nitride (SiNx), and/or silicon oxynitride (SiOxNy). The third inorganic insulating layer 130 may include silicon oxynitride (SiOxNy) and have a refractive index n5 of 1.57 or 1.77. The auxiliary layer SPL_4 may be disposed between the capping layer CPL and the first inorganic insulating layer 110, and the refractive index thereof may be smaller than those of the capping layer CPL and the first inorganic insulating layer 110. The third inorganic insulating layer 130_4 may be disposed between the second inorganic insulating layer 120 and the fourth inorganic insulating layer 140, and the refractive index thereof may be greater than those of the second inorganic insulating layer 120 and the fourth inorganic insulating layer 140, or may be at least greater than the refractive index of the second inorganic insulating layer 120, but may also be the same as the refractive index of the fourth inorganic insulating layer 140.

Referring to FIG. 15, the display device 10, according to an embodiment, may further include a sixth inorganic insulating layer 160_5 disposed between the auxiliary layer SPL and the first inorganic insulating layer 110. The first inorganic insulating layer 160_6 may include silicon oxide (SiOx), silicon nitride (SiNx), and/or silicon oxynitride (SiOxNy). The sixth inorganic insulating layer 160_5 may have a refractive index n4 in a range of 1.48 to 1.70. As an example, the sixth inorganic insulating layer 160_5 may include silicon oxynitride (SiOxNy). The sixth inorganic insulating layer 150_6 may be disposed between the auxiliary layer SPL and the first inorganic insulating layer 110, and the refractive index thereof may be greater than those of the auxiliary layer SPL and the first inorganic insulating layer 110.

The display device 10 of FIGS. 14 and 15 may increase light efficiency or control viewing angle characteristics by adjusting the materials and refractive indices of the plurality of inorganic insulating layers within the above-described ranges, or by further including other inorganic insulating layers. However, the display device 10 may have a structure in which at least a plurality of inorganic insulating layers disposed in contact with each other have different refractive indices, and a layer having a high refractive index and a layer having a low refractive index are stacked. The display device 10 may control the light efficiency and the viewing angle characteristics of the light emitting element ED as desired by designing the refractive index, thickness, and relative arrangement of the plurality of layers disposed on the light emitting element ED as described above. The display device 10 of FIGS. 14 and 15 may control the movement trajectory in the overall color temperature direction on the CIE 1976 coordinate system to be located within the target coordinate range TA.

Figure 16:
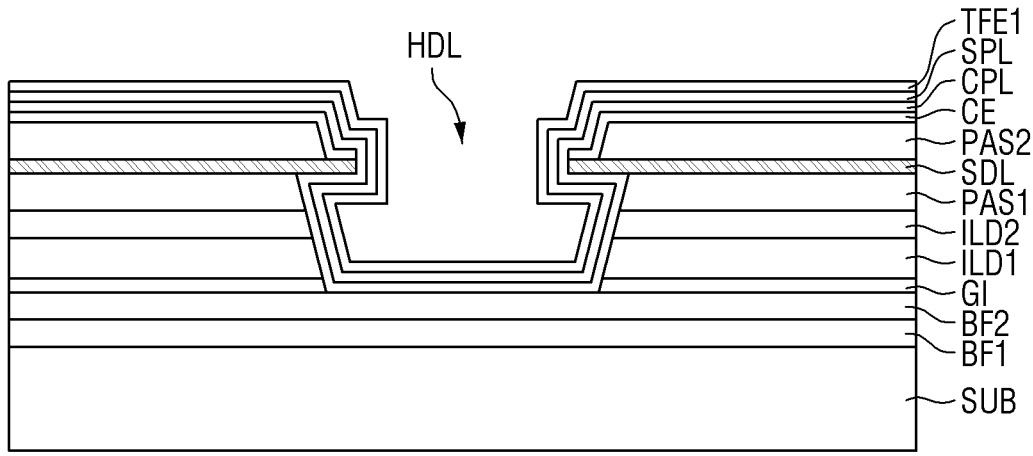
FIG. 16 is a cross-sectional view illustrating holes formed in a second display device and a third display device of a display device according to an embodiment.

FIG. 16 is a cross-sectional view illustrating holes formed in a second display device and a third display device of a display device according to an embodiment.

Referring to FIG. 16, the display device 10, according to an embodiment, may include a hole HOL formed in the second display area DA2 and the third display area DA3 in which the optical device ('500' in FIG. 3) is disposed. The hole HOL may penetrate through the gate insulating layer GI, the first interlayer insulating layer ILD1, the second interlayer insulating layer ILD2, and the first passivation layer PAS1, and may expose a portion of the upper surface of the second buffer layer BF2. The optical device 500 disposed in the second display area DA2 or the third display area DA3 may emit or receive infrared light, ultraviolet light, or visible light band light through the hole HOL.

A metal layer SDL may be disposed on the first passivation layer PAS1 and may be disposed on the same layer as the second connection electrode CNE2 of FIG. 5. The metal layer SDL may include patterns spaced apart from each other with the hole HOL interposed therebetween, and each pattern of the metal layer SDL may include a tip protruding from the side surface of the first passivation layer PAS1 to an inside of the hole HOL. The second passivation layer PAS2 and the common electrode CE may be disposed on the metal layer SDL. The common electrode CE is entirely disposed on the second passivation layer PAS2, and may be disconnected by the tip of the metal layer SDL.

The capping layer CPL, the auxiliary layer SPL, and the first encapsulation layer TFEL1 may be disposed on the common electrode CE. The capping layer CPL, the auxiliary layer SPL, and the first encapsulation layer TFEL1 may include a low refractive inorganic insulating material and may be disposed along an inner wall of the hole HOL. For example, the capping layer CPL, the auxiliary layer SPL, and the first encapsulation layer TFEL1 may also fill a lower portion of the tip of the metal layer SDL. The display device 10 may include the hole HOL formed in the second display area DA2 and the third display area DA3 and the tip structure of the metal layer SDL to form a short circuit structure of the common electrode CE. In addition, the capping layer CPL, the auxiliary layer SPL, and the first encapsulation layer TFEL1 may include inorganic insulating materials having different refractive indices for optical characteristics of the display device 10, and may be disposed along the inner wall of the hole HOL formed in the second display area DA2 and the third display area DA3. The display device 10 may include the capping layer CPL, the auxiliary layer SPL, and the first encapsulation layer TFEL1 to secure optical characteristics and mechanical reliability of the portion in which the hole HOL is formed.

In concluding the detailed description, those skilled in the art will appreciate that many variations and modifications can be made to the embodiments without substantially departing from the principles of the present disclosure.

What is claimed is:

1. A display device, comprising:

a substrate;

a light emitting element disposed on the substrate and including a pixel electrode, a light emitting layer, and a common electrode;

a capping layer disposed on the common electrode of the light emitting element;

an auxiliary layer disposed on the capping layer; and a thin film encapsulation layer including a first encapsulation layer disposed on the auxiliary layer, a second encapsulation layer disposed on the first encapsulation layer, and a third encapsulation layer disposed on the second encapsulation layer, wherein the first encapsulation layer includes:

a first inorganic insulating layer disposed on the auxiliary layer and including silicon nitride;

a second inorganic insulating layer disposed on the first inorganic insulating layer and including silicon oxide; and a third inorganic insulating layer disposed on the second inorganic insulating layer and including silicon oxynitride, wherein the auxiliary layer has a thickness within a range of 200 Å to 1400 Å, wherein the first inorganic insulating layer has a thickness within a range of 400 Å to 3500 Å, wherein the second inorganic insulating layer has a thickness within a range of 200 Å to 2400 Å, and wherein the third inorganic insulating layer has a thickness within a range of 4000 Å or more.

2. The display device of claim 1, wherein the first inorganic insulating layer is disposed directly on the auxiliary layer.

3. The display device of claim 1, wherein the auxiliary layer has a refractive index that is smaller than a refractive index of the capping layer, wherein the first inorganic insulating layer has a refractive index that is greater than the refractive index of the auxiliary layer, wherein the second inorganic insulating layer has a refractive index that is smaller than the refractive index of the first inorganic insulating layer, and wherein the third inorganic insulating layer has a refractive index that is greater than the refractive index of the second inorganic insulating layer.

4. The display device of claim 3, wherein the capping layer has a refractive index in a range of 1.60 to 2.30, wherein the auxiliary layer has a refractive index in a range of 1.20 to 1.62, and is smaller than the refractive index of the capping layer, wherein the first inorganic insulating layer has a refractive index in a range of 1.70 to 2.0, wherein the second inorganic insulating layer has a refractive index in a range of 1.20 to 1.62, and wherein the third inorganic insulating layer has a refractive index in a range of 1.48 to 1.89, and the refractive index of the third inorganic insulating layer is greater than the refractive index of the second inorganic insulating layer.

5. The display device of claim 3, wherein the capping layer has a thickness of 850 Å, wherein the auxiliary layer has a thickness of 400 Å, wherein the first inorganic insulating layer has a thickness of 1300 Å, wherein the second inorganic insulating layer has a thickness of 1400 Å, and wherein the third inorganic insulating layer has a thickness of 7300 Å.

6. The display device of claim 3, wherein the capping layer has a thickness of 770 Å, wherein the auxiliary layer has a thickness of 400 Å, wherein the first inorganic insulating layer has a thickness of 1300 Å, wherein the second inorganic insulating layer has a thickness of 1550 Å, and wherein the third inorganic insulating layer has a thickness of 7300 Å.

7. The display device of claim 3, wherein the capping layer has a thickness of 850 Å, wherein the auxiliary layer has a thickness of 400 Å, wherein the first inorganic insulating layer has a thickness of 1500 Å, wherein the second inorganic insulating layer has a thickness of 400 Å, and wherein the third inorganic insulating layer has a thickness of 7300 Å.

8. The display device of claim 3, wherein the capping layer has a thickness of 750 Å, wherein the auxiliary layer has a thickness of 400 Å, wherein the first inorganic insulating layer has a thickness of 1600 Å, wherein the second inorganic insulating layer has a thickness of 400 Å, and wherein the third inorganic insulating layer has a thickness of 7300 Å.

9. The display device of claim 1, wherein the first encapsulation layer further includes a fourth inorganic insulating layer disposed on the third inorganic insulating layer, and a fifth inorganic insulating layer disposed on the fourth inorganic insulating layer, and wherein the fourth inorganic insulating layer includes silicon oxynitride and has a thickness of within a range of 300 Å to 1000 Å.

10. The display device of claim 9, wherein the fourth inorganic insulating layer has a refractive index that is smaller than a refractive index of the third inorganic insulating layer, and wherein the fifth inorganic insulating layer has a refractive index that is smaller than the refractive index of the fourth inorganic insulating layer.

11. The display device of claim 9, wherein the fourth inorganic insulating layer has a thickness of 700 Å, and wherein the fifth inorganic insulating layer has a thickness of 800 Å.

12. The display device of claim 9, further comprising a sixth inorganic insulating layer disposed between the first inorganic insulating layer and the auxiliary layer, wherein the sixth inorganic insulating layer includes silicon oxynitride and has a refractive index that is smaller than a refractive index of the fifth inorganic insulating layer.

13. A display device, comprising:

a substrate;

a light emitting element disposed on the substrate and including a pixel electrode, a light emitting layer, and a common electrode;

a capping layer disposed on the common electrode of the light emitting element;

an auxiliary layer disposed on the capping layer; and a thin film encapsulation layer including a first encapsulation layer disposed on the auxiliary layer, a second encapsulation layer disposed on the first encapsulation layer, and a third encapsulation layer disposed on the second encapsulation layer, wherein the first encapsulation layer includes:

a first inorganic insulating layer disposed on the auxiliary layer and including silicon nitride;

a second inorganic insulating layer disposed on the first inorganic insulating layer and including silicon oxide; and a third inorganic insulating layer disposed on the second inorganic insulating layer and including silicon oxynitride, wherein the capping layer has a refractive index in a range of 1.60 to 2.30, wherein the auxiliary layer has a refractive index in a range of 1.20 to 1.62, and is smaller than the refractive index of the capping layer, wherein the first inorganic insulating layer has a refractive index in a range of 1.70 to 2.0, wherein the second inorganic insulating layer has a refractive index in a range of 1.20 to 1.62, and wherein the third inorganic insulating layer has a refractive index in a range of 1.48 to 1.89, and the refractive index of the third inorganic insulating layer is greater than the refractive index of the second inorganic insulating layer.

14. The display device of claim 13, wherein the auxiliary layer has a refractive index that is smaller than the refractive index of the capping layer, wherein the first inorganic insulating layer has a refractive index that is greater than the refractive index of the auxiliary layer, wherein the second inorganic insulating layer has a refractive index that is smaller than the refractive index of the first inorganic insulating layer, and wherein the third inorganic insulating layer has a refractive index that is greater than the refractive index of the second inorganic insulating layer.

15. The display device of claim 14, wherein the capping layer has a refractive index of 1.97, wherein the first inorganic insulating layer has a refractive index of 1.89, and wherein the second inorganic insulating layer has a refractive index of 1.48.

16. The display device of claim 15, wherein the auxiliary layer includes lithium fluoride (LiF) and has a refractive index of 1.39.

17. The display device of claim 15, wherein the auxiliary layer includes silicon oxynitride and has a refractive index in a range of 1.48 to 1.57.

18. The display device of claim 15, wherein the third inorganic insulating layer a the refractive index of 1.62.

19. The display device of claim 15, wherein the third inorganic insulating layer has a refractive index of 1.57 to 1.77.

20. The display device of claim 13, further comprising a sixth inorganic insulating layer disposed between the first inorganic insulating layer and the auxiliary layer, wherein the sixth inorganic insulating layer includes silicon oxynitride and has a refractive index in a range of 1.48 to 1.7, and the refractive index of the sixth inorganic insulating layer is smaller than the refractive index of the first inorganic insulating layer.

21. An electronic device, comprising:

a display device including a display area and a non-display area at least partially surrounding the display area; and an optical device overlapping a portion of the display area of the display device, wherein the display device includes:

a substrate;

a light emitting element disposed on the substrate and including a pixel electrode, a light emitting layer, and a common electrode;

a capping layer disposed on the common electrode of the light emitting element;

an auxiliary layer disposed on the capping layer; and a thin film encapsulation layer including a first encapsulation layer disposed on the auxiliary layer, a second encapsulation layer disposed on the first encapsulation layer, and a third encapsulation layer disposed on the second encapsulation layer, wherein the first encapsulation layer includes:

a first inorganic insulating layer disposed on the auxiliary layer and including silicon nitride;

a second inorganic insulating layer disposed on the first inorganic insulating layer and including silicon oxide; and a third inorganic insulating layer disposed on the second inorganic insulating layer and including silicon oxynitride, wherein the auxiliary layer has a thickness in a range of 200 Å to 1400 Å, wherein the first inorganic insulating layer has a thickness in a range of 400 Å to 3500 Å, wherein the second inorganic insulating layer has a thickness in a range of 200 Å to 2400 Å, and wherein the third inorganic insulating layer has a thickness in a range of 4000 Å or more.

22. The electronic device of claim 21, wherein the capping layer has a refractive index in a range of 1.60 to 2.30, wherein the auxiliary layer has a refractive index in a range of 1.20 to 1.62, and the refractive index of the auxiliary layer is smaller than the refractive index of the capping layer, wherein the first inorganic insulating layer has a refractive index in a range of 1.70 to 2.0, wherein the second inorganic insulating layer has a refractive index in a range of 1.20 to 1.62, and wherein the third inorganic insulating layer has a refractive index in a range of 1.48 to 1.89, and the refractive index of the third inorganic insulating layer is greater than the refractive index of the second inorganic insulating layer.

23. The electronic device of claim 21, wherein the first encapsulation layer further includes a fourth inorganic insulating layer disposed on the third inorganic insulating layer, and a fifth inorganic insulating layer disposed on the fourth inorganic insulating layer, and wherein the fourth inorganic insulating layer includes silicon oxynitride and has a thickness in a range of 300 Å to 1000 Å, wherein the fourth inorganic insulating layer has a refractive index that is smaller than a refractive index of the third inorganic insulating layer, and wherein the fifth inorganic insulating layer has a refractive index that is smaller than the refractive index of the fourth inorganic insulating layer.

\* \* \* \* \*